(12) United States Patent
Tanitsu

(10) Patent No.: US 9,057,877 B2
(45) Date of Patent: Jun. 16, 2015

(54) OPTICAL UNIT, ILLUMINATION OPTICAL APPARATUS, EXPOSURE APPARATUS, AND DEVICE MANUFACTURING METHOD

(75) Inventor: Osamu Tanitsu, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 438 days.

(21) Appl. No.: 13/449,115

(22) Filed: Apr. 17, 2012

(65) Prior Publication Data

US 2012/0202157 A1  Aug. 9, 2012

Related U.S. Application Data

(62) Division of application No. 12/245,021, filed on Oct. 3, 2008, now Pat. No. 8,379,187.

(60) Provisional application No. 61/006,446, filed on Jan. 14, 2008, provisional application No. 60/960,996, filed on Oct. 24, 2007.

(51) Int. Cl.

| G03B 27/54 | (2006.01) |
| G03B 27/72 | (2006.01) |
| G02B 27/09 | (2006.01) |
| G03F 7/20  | (2006.01) |
| G02B 27/28 | (2006.01) |

(52) U.S. Cl.
CPC ........ G02B 27/0927 (2013.01); G02B 27/0938 (2013.01); G03F 7/70116 (2013.01); G03F 7/70566 (2013.01); G02B 27/286 (2013.01)

(58) Field of Classification Search
CPC ............ G03F 7/70116; G02B 27/0927; G02B 27/286

USPC .................................... 355/52, 53, 55, 67, 71
See application file for complete search history.

(56) References Cited

U.S. PATENT DOCUMENTS

| 4,295,735 A | 10/1981 | Lacombat et al. |
| 4,346,164 A | 8/1982 | Tabarelli et al. |
| 5,153,428 A | 10/1992 | Ellis |
| 5,216,541 A | 6/1993 | Takesue et al. |
| 5,229,872 A | 7/1993 | Mumola |

(Continued)

FOREIGN PATENT DOCUMENTS

| CN | 1461973 | 12/2003 |
| CN | 1501175 A | 6/2004 |

(Continued)

OTHER PUBLICATIONS

May 14, 2013 Office Action issued in Japanese Patent Application No. P2010-506474 (with translation).

(Continued)

*Primary Examiner* — Hung Henry Nguyen
(74) *Attorney, Agent, or Firm* — Oliff PLC

(57) ABSTRACT

An illumination optical apparatus has an optical unit. The optical unit has a light splitter to split an incident beam into two beams; a first spatial light modulator which can be arranged in an optical path of a first beam; a second spatial light modulator which can be arranged in an optical path of a second beam; and a light combiner which combines a beam having passed via the first spatial light modulator, with a beam having passed via the second spatial light modulator; each of the first spatial light modulator and the second spatial light modulator has a plurality of optical elements arranged two-dimensionally and controlled individually.

5 Claims, 14 Drawing Sheets

(56) References Cited

U.S. PATENT DOCUMENTS

| | | |
|---|---|---|
| 5,251,222 A | 10/1993 | Hester et al. |
| 5,312,513 A | 5/1994 | Florence et al. |
| 5,383,000 A | 1/1995 | Michaloski et al. |
| 5,461,410 A | 10/1995 | Venkateswar et al. |
| 5,850,310 A | 12/1998 | Schweizer |
| 5,991,009 A | 11/1999 | Nishi et al. |
| 6,406,148 B1 | 6/2002 | Marshall et al. |
| 6,466,304 B1 | 10/2002 | Smith |
| 6,577,379 B1 | 6/2003 | Boettiger et al. |
| 6,577,429 B1 | 6/2003 | Kurtz et al. |
| 6,665,119 B1 | 12/2003 | Kurtz et al. |
| 6,737,662 B2 | 5/2004 | Mulder et al. |
| 6,819,490 B2 | 11/2004 | Sandstrom et al. |
| 6,829,090 B2 | 12/2004 | Katsumata et al. |
| 6,844,927 B2 | 1/2005 | Stokowski et al. |
| 6,885,493 B2 | 4/2005 | Ljungbald et al. |
| 6,891,655 B2 | 5/2005 | Grebinski et al. |
| 6,900,827 B2 * | 5/2005 | Taniguchi .................. 347/255 |
| 6,900,915 B2 | 5/2005 | Nanijo et al. |
| 6,913,373 B2 | 7/2005 | Tanaka et al. |
| 6,958,806 B2 | 10/2005 | Mulder et al. |
| 6,958,867 B2 | 10/2005 | Ohmori et al. |
| 6,960,035 B2 | 11/2005 | Okazaki et al. |
| 6,961,116 B2 | 11/2005 | Den Boef et al. |
| 6,977,718 B1 | 12/2005 | LaFontaine |
| 7,015,491 B2 | 3/2006 | Eurlings et al. |
| 7,030,962 B2 | 4/2006 | Iizuka et al. |
| 7,061,226 B2 | 6/2006 | Dürr |
| 7,064,880 B2 | 6/2006 | Mushika |
| 7,088,426 B2 | 8/2006 | Hirukawa et al. |
| 7,095,481 B2 | 8/2006 | Morohoshi |
| 7,095,546 B2 | 8/2006 | Mala et al. |
| 7,095,921 B2 | 8/2006 | Okazaki et al. |
| 7,102,731 B2 | 9/2006 | Hirukawa et al. |
| 7,116,403 B2 | 10/2006 | Troost et al. |
| 7,116,478 B2 | 10/2006 | Momoki et al. |
| 7,121,740 B2 | 10/2006 | Okazaki et al. |
| 7,130,021 B2 | 10/2006 | Kobayashi |
| 7,130,120 B2 | 10/2006 | Katsumata et al. |
| 7,148,952 B2 | 12/2006 | Eurlings et al. |
| 7,177,012 B2 | 2/2007 | Bleeker et al. |
| 7,193,684 B2 | 3/2007 | Iizuka et al. |
| 7,259,827 B2 | 8/2007 | Dierichs |
| 7,289,276 B2 | 10/2007 | Ohmori et al. |
| 7,400,382 B2 | 7/2008 | Baba-Ali et al. |
| 7,423,731 B2 | 9/2008 | Tanitsu et al. |
| 7,508,492 B2 | 3/2009 | Sekigawa et al. |
| 7,525,642 B2 | 4/2009 | Mulder et al. |
| 7,532,378 B2 | 5/2009 | Tanaka et al. |
| 7,542,129 B2 * | 6/2009 | Sandstrom .................. 355/67 |
| 7,551,261 B2 | 6/2009 | Fiolka |
| 7,573,052 B2 | 8/2009 | Inoue et al. |
| 7,573,564 B2 | 8/2009 | Ruff et al. |
| 7,580,559 B2 | 8/2009 | Latypov et al. |
| 7,605,386 B2 | 10/2009 | Singer et al. |
| 7,701,555 B2 | 4/2010 | Arai |
| 7,714,983 B2 | 5/2010 | Koehler et al. |
| 7,965,380 B2 | 6/2011 | Bleeker et al. |
| 8,018,589 B2 | 9/2011 | Mackinnon et al. |
| 2003/0038225 A1 | 2/2003 | Mulder et al. |
| 2003/0071204 A1 | 4/2003 | Sandstrom et al. |
| 2003/0098959 A1 | 5/2003 | Hagiwara et al. |
| 2003/0214571 A1 | 11/2003 | Ishikawa et al. |
| 2004/0053148 A1 | 3/2004 | Morohoshi |
| 2004/0057034 A1 | 3/2004 | Zinn et al. |
| 2004/0100629 A1 | 5/2004 | Stokowski et al. |
| 2004/0108467 A1 | 6/2004 | Eurlings et al. |
| 2004/0130775 A1 | 7/2004 | Grebinski |
| 2004/0160582 A1 | 8/2004 | Lof et al. |
| 2004/0207386 A1 | 10/2004 | Durr |
| 2005/0024612 A1 | 2/2005 | Hirukawa et al. |
| 2005/0094122 A1 | 5/2005 | Hagiwara et al. |
| 2005/0095746 A1 | 5/2005 | Aoyagi |
| 2005/0141583 A1 | 6/2005 | Sandstrom |
| 2005/0168790 A1 | 8/2005 | Latypov et al. |
| 2005/0213068 A1 | 9/2005 | Ishii et al. |
| 2005/0231703 A1 | 10/2005 | Kobayashi |
| 2005/0270515 A1 | 12/2005 | Troost et al. |
| 2005/0281516 A1 | 12/2005 | Okazaki et al. |
| 2006/0050261 A1 | 3/2006 | Brotsack |
| 2006/0055834 A1 | 3/2006 | Tanitsu et al. |
| 2006/0114446 A1 | 6/2006 | Gui |
| 2006/0138349 A1 | 6/2006 | Bleeker et al. |
| 2006/0175556 A1 | 8/2006 | Yabuki |
| 2006/0176452 A1 | 8/2006 | Kim et al. |
| 2006/0227306 A1 | 10/2006 | Hirukawa et al. |
| 2006/0232841 A1 | 10/2006 | Toishi et al. |
| 2006/0245033 A1 | 11/2006 | Baba-Ali et al. |
| 2007/0013888 A1 | 1/2007 | Flagello et al. |
| 2007/0146676 A1 | 6/2007 | Tanitsu et al. |
| 2007/0165202 A1 | 7/2007 | Koehler et al. |
| 2007/0195305 A1 | 8/2007 | Mulder et al. |
| 2007/0201338 A1 | 8/2007 | Yaoita et al. |
| 2007/0273852 A1 | 11/2007 | Arai |
| 2007/0273853 A1 | 11/2007 | Bleeker et al. |
| 2007/0296936 A1 | 12/2007 | Kato et al. |
| 2008/0013065 A1 | 1/2008 | Kohl |
| 2008/0021948 A1 | 1/2008 | Wilson et al. |
| 2008/0079930 A1 | 4/2008 | Klarenbeek |
| 2008/0095531 A1 | 4/2008 | Yeo et al. |
| 2008/0239268 A1 | 10/2008 | Mulder et al. |
| 2008/0259304 A1 | 10/2008 | Dierichs |
| 2009/0021656 A1 | 1/2009 | Ozaki |
| 2009/0033902 A1 | 2/2009 | Mulder et al. |
| 2009/0073411 A1 | 3/2009 | Tanitsu |
| 2009/0091730 A1 | 4/2009 | Tanaka |
| 2009/0097007 A1 | 4/2009 | Tanaka |
| 2009/0097094 A1 | 4/2009 | Tanaka |
| 2009/0109417 A1 | 4/2009 | Tanitsu |
| 2009/0128886 A1 | 5/2009 | Hirota |
| 2009/0147247 A1 | 6/2009 | Endo et al. |
| 2009/0174877 A1 | 7/2009 | Mulder et al. |
| 2009/0263736 A1 | 10/2009 | Inoue et al. |
| 2010/0195077 A1 | 8/2010 | Koehler et al. |
| 2012/0202157 A1 | 8/2012 | Tanitsu |
| 2012/0236284 A1 | 9/2012 | Tanaka |

FOREIGN PATENT DOCUMENTS

| | | |
|---|---|---|
| CN | 1573571 A | 2/2005 |
| CN | 1601322 A | 3/2005 |
| CN | 1879062 A | 12/2006 |
| DE | 206 607 | 2/1984 |
| DE | 221 563 A1 | 4/1985 |
| DE | 224 448 A1 | 7/1985 |
| DE | 242 880 A1 | 2/1987 |
| DE | 196 35 792 A1 | 4/1997 |
| DE | 100 29 938 A1 | 7/2001 |
| DE | 103 43 333 A1 | 4/2005 |
| EP | 0 023 231 A1 | 2/1981 |
| EP | 0 208 552 A2 | 1/1987 |
| EP | 0 656 555 A1 | 6/1995 |
| EP | 0 764 858 A2 | 3/1997 |
| EP | 0 779 530 | 5/1997 |
| EP | 1 109 067 | 6/2001 |
| EP | 1 211 561 A2 | 6/2002 |
| EP | 1 262 836 A1 | 12/2002 |
| EP | 1 280 007 A2 | 1/2003 |
| EP | 1367442 | 12/2003 |
| EP | 1 395 049 A1 | 3/2004 |
| EP | 1 489 462 A2 | 12/2004 |
| EP | 1 674 935 A2 | 6/2006 |
| EP | 1826616 | 2/2007 |
| EP | 1 798 758 A1 | 6/2007 |
| EP | 1 843 204 | 10/2007 |
| EP | 1 882 895 A1 | 1/2008 |
| EP | 1 993 120 A1 | 11/2008 |
| FR | 2 474 708 | 7/1981 |
| JP | A-44-4993 | 2/1969 |
| JP | A-56-6666 | 1/1981 |
| JP | A-57-117238 | 7/1982 |
| JP | A-57-152129 | 9/1982 |
| JP | A-57-153433 | 9/1982 |
| JP | A-58-49932 | 3/1983 |

(56) References Cited

FOREIGN PATENT DOCUMENTS

| | | |
|---|---|---|
| JP | U-58-45502 | 3/1983 |
| JP | A-58-115945 | 7/1983 |
| JP | A-58-202448 | 11/1983 |
| JP | A-59-19912 | 2/1984 |
| JP | A-59-155843 | 9/1984 |
| JP | A-59-226317 | 12/1984 |
| JP | A-61-44429 | 3/1986 |
| JP | A-61-45923 | 3/1986 |
| JP | A-61-91662 | 5/1986 |
| JP | U-61-94342 | 6/1986 |
| JP | A-61-156736 | 7/1986 |
| JP | A-61-196532 | 8/1986 |
| JP | A-61-217434 | 9/1986 |
| JP | A-61-251025 | 11/1986 |
| JP | A-61-270049 | 11/1986 |
| JP | A-62-2539 | 1/1987 |
| JP | A-62-2540 | 1/1987 |
| JP | A-62-17705 | 1/1987 |
| JP | A-62-65326 | 3/1987 |
| JP | A-62-100161 | 5/1987 |
| JP | A-62-120026 | 6/1987 |
| JP | A-62-121417 | 6/1987 |
| JP | A-62-122215 | 6/1987 |
| JP | A-62-153710 | 7/1987 |
| JP | A-62-183522 | 8/1987 |
| JP | A-62-188316 | 8/1987 |
| JP | A-62-203526 | 9/1987 |
| JP | A-63-12134 | 1/1988 |
| JP | A-63-36526 | 2/1988 |
| JP | A-63-73628 | 4/1988 |
| JP | A-63-128713 | 6/1988 |
| JP | A-63-131008 | 6/1988 |
| JP | A-63-141313 | 6/1988 |
| JP | A-63-157419 | 6/1988 |
| JP | A-63-160192 | 7/1988 |
| JP | A-63-231217 | 9/1988 |
| JP | A-63-275912 | 11/1988 |
| JP | A-63-292005 | 11/1988 |
| JP | A-64-18002 | 1/1989 |
| JP | A-64-26704 | 2/1989 |
| JP | A-64-68926 | 3/1989 |
| JP | A-1-91419 | 4/1989 |
| JP | A-1-115033 | 5/1989 |
| JP | A-1-147516 | 6/1989 |
| JP | A-1-202833 | 8/1989 |
| JP | A-1-214042 | 8/1989 |
| JP | U-1-127379 | 8/1989 |
| JP | A-1-255404 | 10/1989 |
| JP | A-1-258990 | 10/1989 |
| JP | A-1-276043 | 11/1989 |
| JP | A-1-278240 | 11/1989 |
| JP | A-1-286478 | 11/1989 |
| JP | A-1-292343 | 11/1989 |
| JP | A-1-314247 | 12/1989 |
| JP | A-1-319964 | 12/1989 |
| JP | A-2-42382 | 2/1990 |
| JP | A-2-65149 | 3/1990 |
| JP | A-2-65222 | 3/1990 |
| JP | A-2-97239 | 4/1990 |
| JP | A-2-106917 | 4/1990 |
| JP | A-2-116115 | 4/1990 |
| JP | A-2-139146 | 5/1990 |
| JP | A-2-166717 | 6/1990 |
| JP | A-2-261073 | 10/1990 |
| JP | A-2-264901 | 10/1990 |
| JP | A-2-285320 | 11/1990 |
| JP | A-2-287308 | 11/1990 |
| JP | A-2-298431 | 12/1990 |
| JP | A-2-311237 | 12/1990 |
| JP | A-3-41399 | 2/1991 |
| JP | A-3-64811 | 3/1991 |
| JP | A-3-72298 | 3/1991 |
| JP | A-3-94445 | 4/1991 |
| JP | A-3-132663 | 6/1991 |
| JP | A-3-134341 | 6/1991 |
| JP | A-3-167419 | 7/1991 |
| JP | A-3-168640 | 7/1991 |
| JP | A-3-211812 | 9/1991 |
| JP | A-3-263810 | 11/1991 |
| JP | A-4-11613 | 1/1992 |
| JP | A-4-32154 | 2/1992 |
| JP | A-4-065603 | 3/1992 |
| JP | A-4-96315 | 3/1992 |
| JP | A-4-101148 | 4/1992 |
| JP | A-4-130710 | 5/1992 |
| JP | A-4-132909 | 5/1992 |
| JP | A-4-133414 | 5/1992 |
| JP | A-4-152512 | 5/1992 |
| JP | A-4-179115 | 6/1992 |
| JP | A-4-186244 | 7/1992 |
| JP | U-4-80052 | 7/1992 |
| JP | A-4-211110 | 8/1992 |
| JP | A-4-225357 | 8/1992 |
| JP | A-4-235558 | 8/1992 |
| JP | A-4-265805 | 9/1992 |
| JP | A-4-273245 | 9/1992 |
| JP | A-4-273427 | 9/1992 |
| JP | A-4-280619 | 10/1992 |
| JP | A-4-282539 | 10/1992 |
| JP | A-4-296092 | 10/1992 |
| JP | A-4-297030 | 10/1992 |
| JP | A-4-305915 | 10/1992 |
| JP | A-4-305917 | 10/1992 |
| JP | U-4-117212 | 10/1992 |
| JP | A-4-330961 | 11/1992 |
| JP | A-4-343307 | 11/1992 |
| JP | A-4-350925 | 12/1992 |
| JP | A-5-13292 | 1/1993 |
| JP | A-5-21314 | 1/1993 |
| JP | A-5-45886 | 2/1993 |
| JP | A-5-62877 | 3/1993 |
| JP | A-5-90128 | 4/1993 |
| JP | A-5-109601 | 4/1993 |
| JP | A-5-127086 | 5/1993 |
| JP | A-5-129184 | 5/1993 |
| JP | A-5-134230 | 5/1993 |
| JP | A-5-160002 | 6/1993 |
| JP | A-5-175098 | 7/1993 |
| JP | A-5-199680 | 8/1993 |
| JP | A-5-217837 | 8/1993 |
| JP | A-5-217840 | 8/1993 |
| JP | A-5-241324 | 9/1993 |
| JP | A-5-243364 | 9/1993 |
| JP | A-5-259069 | 10/1993 |
| JP | A-5-283317 | 10/1993 |
| JP | A-5-304072 | 11/1993 |
| JP | A-5-319774 | 12/1993 |
| JP | A-5-323583 | 12/1993 |
| JP | A-5-326370 | 12/1993 |
| JP | A-6-29204 | 2/1994 |
| JP | A-6-42918 | 2/1994 |
| JP | A-6-53120 | 2/1994 |
| JP | A-6-29102 | 4/1994 |
| JP | A-6-97269 | 4/1994 |
| JP | A-6-104167 | 4/1994 |
| JP | A-6-120110 | 4/1994 |
| JP | A-6-6-36054 | 5/1994 |
| JP | A-6-124126 | 5/1994 |
| JP | A-6-124872 | 5/1994 |
| JP | A-6-124873 | 5/1994 |
| JP | A-6-140306 | 5/1994 |
| JP | A-6-148399 | 5/1994 |
| JP | A-6-163350 | 6/1994 |
| JP | A-6-168866 | 6/1994 |
| JP | A-6-177007 | 6/1994 |
| JP | A-6-181157 | 6/1994 |
| JP | A-6-186025 | 7/1994 |
| JP | A-6-188169 | 7/1994 |
| JP | A-6-196388 | 7/1994 |
| JP | A-6-204113 | 7/1994 |
| JP | A-6-204121 | 7/1994 |
| JP | A-6-229741 | 8/1994 |
| JP | A-6-241720 | 9/1994 |
| JP | A-6-244082 | 9/1994 |

(56) References Cited

FOREIGN PATENT DOCUMENTS

| | | |
|---|---|---|
| JP | A-6-267825 | 9/1994 |
| JP | A-6-283403 | 10/1994 |
| JP | A-06-291023 | 10/1994 |
| JP | A-6-310399 | 11/1994 |
| JP | A-6-325894 | 11/1994 |
| JP | A-6-326174 | 11/1994 |
| JP | A-6-349701 | 12/1994 |
| JP | A-7-69621 | 3/1995 |
| JP | A-7-92424 | 4/1995 |
| JP | A-7-122469 | 5/1995 |
| JP | A-7-132262 | 5/1995 |
| JP | A-7-134955 | 5/1995 |
| JP | A-7-135158 | 5/1995 |
| JP | A-7-135165 | 5/1995 |
| JP | A-7-147223 | 6/1995 |
| JP | A-7-167998 | 7/1995 |
| JP | A-7-168286 | 7/1995 |
| JP | A-7-174974 | 7/1995 |
| JP | A-7-176468 | 7/1995 |
| JP | A-7-183201 | 7/1995 |
| JP | A-7-183214 | 7/1995 |
| JP | A-7-190741 | 7/1995 |
| JP | A-7-201723 | 8/1995 |
| JP | A-7-220989 | 8/1995 |
| JP | A-7-220990 | 8/1995 |
| JP | A-7-220995 | 8/1995 |
| JP | A-7-221010 | 8/1995 |
| JP | A-7-239212 | 9/1995 |
| JP | A-7-243814 | 9/1995 |
| JP | A-7-245258 | 9/1995 |
| JP | A-7-263315 | 10/1995 |
| JP | A-7-283119 | 10/1995 |
| JP | A-7-297272 | 11/1995 |
| JP | A-7-307268 | 11/1995 |
| JP | A-7-318847 | 12/1995 |
| JP | A-7-335748 | 12/1995 |
| JP | A-8-10971 | 1/1996 |
| JP | A-8-17709 | 1/1996 |
| JP | A-8-22948 | 1/1996 |
| JP | A-8-37149 | 2/1996 |
| JP | A-8-37227 | 2/1996 |
| JP | A-8-46751 | 2/1996 |
| JP | A-8-63231 | 3/1996 |
| JP | A-8-115868 | 5/1996 |
| JP | A-8-136475 | 5/1996 |
| JP | A-8-151220 | 6/1996 |
| JP | A-8-162397 | 6/1996 |
| JP | A-8-166475 | 6/1996 |
| JP | A-8-171054 | 7/1996 |
| JP | A-8-195375 | 7/1996 |
| JP | A-8-203803 | 8/1996 |
| JP | A-8-279549 | 10/1996 |
| JP | A-8-288213 | 11/1996 |
| JP | A-8-297699 | 11/1996 |
| JP | A-8-313842 | 11/1996 |
| JP | A-8-316125 | 11/1996 |
| JP | A-8-316133 | 11/1996 |
| JP | A-8-330224 | 12/1996 |
| JP | A-8-334695 | 12/1996 |
| JP | A-8-335552 | 12/1996 |
| JP | A-9-7933 | 1/1997 |
| JP | A-9-15834 | 1/1997 |
| JP | A-9-22121 | 1/1997 |
| JP | A-9-61686 | 3/1997 |
| JP | A-9-82626 | 3/1997 |
| JP | A-9-83877 | 3/1997 |
| JP | A-9-92593 | 4/1997 |
| JP | A-9-108551 | 4/1997 |
| JP | A-9-115794 | 5/1997 |
| JP | A-9-134870 | 5/1997 |
| JP | A-9-148406 | 6/1997 |
| JP | A-9-151658 | 6/1997 |
| JP | A-9-160004 | 6/1997 |
| JP | A-9-160219 | 6/1997 |
| JP | A-9-162106 | 6/1997 |
| JP | A-9-178415 | 7/1997 |
| JP | A-9-184787 | 7/1997 |
| JP | A-9-184918 | 7/1997 |
| JP | A-9-186082 | 7/1997 |
| JP | A-9-190969 | 7/1997 |
| JP | A-9-213129 | 8/1997 |
| JP | A-9-219358 | 8/1997 |
| JP | A-9-215208 | 9/1997 |
| JP | A-9-227294 | 9/1997 |
| JP | A-9-232213 | 9/1997 |
| JP | A-9-243892 | 9/1997 |
| JP | A-9-246672 | 9/1997 |
| JP | A-9-281077 | 10/1997 |
| JP | A-9-325255 | 12/1997 |
| JP | A-9-326338 | 12/1997 |
| JP | A-10-002865 | 1/1998 |
| JP | A-10-3039 | 1/1998 |
| JP | A-10-20195 | 1/1998 |
| JP | A-10-32160 | 2/1998 |
| JP | A-10-38517 | 2/1998 |
| JP | A-10-38812 | 2/1998 |
| JP | A-10-55713 | 2/1998 |
| JP | A-10-62305 | 3/1998 |
| JP | A-10-64790 | 3/1998 |
| JP | A-10-79337 | 3/1998 |
| JP | A-10-82611 | 3/1998 |
| JP | A-10-92735 | 4/1998 |
| JP | A-10-97969 | 4/1998 |
| JP | A-10-104427 | 4/1998 |
| JP | A-10-116760 | 5/1998 |
| JP | A-10-116778 | 5/1998 |
| JP | A-10-135099 | 5/1998 |
| JP | A-H10-116779 | 5/1998 |
| JP | A-H10-125572 | 5/1998 |
| JP | A-H10-134028 | 5/1998 |
| JP | A-10-163099 | 6/1998 |
| JP | A-10-163302 | 6/1998 |
| JP | A-10-169249 | 6/1998 |
| JP | A-10-189427 | 7/1998 |
| JP | A-10-189700 | 7/1998 |
| JP | A-10-206714 | 8/1998 |
| JP | A-10-208993 | 8/1998 |
| JP | A-10-209018 | 8/1998 |
| JP | A-10-214783 | 8/1998 |
| JP | A-10-228661 | 8/1998 |
| JP | A-10-255319 | 9/1998 |
| JP | A-10-294268 | 11/1998 |
| JP | A-10-303114 | 11/1998 |
| JP | A-10-340846 | 12/1998 |
| JP | A-11-3849 | 1/1999 |
| JP | A-11-003849 | 1/1999 |
| JP | A-11-3856 | 1/1999 |
| JP | A-11-8194 | 1/1999 |
| JP | A-11-14876 | 1/1999 |
| JP | A-11-16816 | 1/1999 |
| JP | A-11-40657 | 2/1999 |
| JP | A-11-54426 | 2/1999 |
| JP | A-11-74185 | 3/1999 |
| JP | A-11-87237 | 3/1999 |
| JP | A-11-111601 | 4/1999 |
| JP | A-11-111818 | 4/1999 |
| JP | A-11-111819 | 4/1999 |
| JP | A-11-121328 | 4/1999 |
| JP | A-11-135400 | 5/1999 |
| JP | A-11-142556 | 5/1999 |
| JP | A-11-150062 | 6/1999 |
| JP | A-11-159571 | 6/1999 |
| JP | A-11-162831 | 6/1999 |
| JP | A-11-163103 | 6/1999 |
| JP | A-11-164543 | 6/1999 |
| JP | A-11-166990 | 6/1999 |
| JP | A-11-98 | 7/1999 |
| JP | A-11-176727 | 7/1999 |
| JP | A-11-176744 | 7/1999 |
| JP | A-11-195602 | 7/1999 |
| JP | A-11-204390 | 7/1999 |
| JP | A-11-218466 | 8/1999 |
| JP | A-11-219882 | 8/1999 |
| JP | A-11-233434 | 8/1999 |

(56) References Cited

FOREIGN PATENT DOCUMENTS

| | | |
|---|---|---|
| JP | A-11-238680 | 8/1999 |
| JP | A-11-239758 | 9/1999 |
| JP | A-11-260686 | 9/1999 |
| JP | A-11-260791 | 9/1999 |
| JP | A-11-264756 | 9/1999 |
| JP | A-11-283903 | 10/1999 |
| JP | A-11-288879 | 10/1999 |
| JP | A-11-307610 | 11/1999 |
| JP | A-11-312631 | 11/1999 |
| JP | A-11-354624 | 12/1999 |
| JP | A-2000-3874 | 1/2000 |
| JP | A-2000-12453 | 1/2000 |
| JP | A-2000-21742 | 1/2000 |
| JP | A-2000-21748 | 1/2000 |
| JP | A-2000-29202 | 1/2000 |
| JP | A-2000-32403 | 1/2000 |
| JP | A-2000-36449 | 2/2000 |
| JP | A-2000-58436 | 2/2000 |
| JP | A-2000-81320 | 3/2000 |
| JP | A-2000-92815 | 3/2000 |
| JP | A-2000-97616 | 4/2000 |
| JP | A-2000-106340 | 4/2000 |
| JP | A-2000-114157 | 4/2000 |
| JP | A-2000-121491 | 4/2000 |
| JP | A-2000-121498 | 4/2000 |
| JP | A-2000-147346 | 5/2000 |
| JP | A-2000-154251 | 6/2000 |
| JP | A-2000-180371 | 6/2000 |
| JP | A-2000-206279 | 7/2000 |
| JP | A-2000-208407 | 7/2000 |
| JP | A-2000-240717 | 9/2000 |
| JP | A-2000-243684 | 9/2000 |
| JP | A-2000-252201 | 9/2000 |
| JP | A-2000-283889 | 10/2000 |
| JP | A-2000-2861766 | 10/2000 |
| JP | A-2000-311853 | 11/2000 |
| JP | A-2000-323403 | 11/2000 |
| JP | A-2001-7015 | 1/2001 |
| JP | A-2001-20951 | 1/2001 |
| JP | A-2001-37201 | 1/2001 |
| JP | A-2001-44097 | 2/2001 |
| JP | A-2001-74240 | 3/2001 |
| JP | A-2001-82472 | 3/2001 |
| JP | A-2001-85307 | 3/2001 |
| JP | A-2001-97734 | 4/2001 |
| JP | A-2001-110707 | 4/2001 |
| JP | A-2001-118773 | 4/2001 |
| JP | A-2001-135560 | 5/2001 |
| JP | A-2001-144004 | 5/2001 |
| JP | A-2001-167996 | 6/2001 |
| JP | A-2001-176766 | 6/2001 |
| JP | A-2001-203140 | 7/2001 |
| JP | A-2001-218497 | 8/2001 |
| JP | A-2001-228401 | 8/2001 |
| JP | A-2001-228404 | 8/2001 |
| JP | A-2001-230323 | 8/2001 |
| JP | A-2001-242269 | 9/2001 |
| JP | A-2001-265581 | 9/2001 |
| JP | A-2001-267227 | 9/2001 |
| JP | A-2001-272764 | 10/2001 |
| JP | A-2001-274083 | 10/2001 |
| JP | A-2001-282526 | 10/2001 |
| JP | A-2001-296105 | 10/2001 |
| JP | A-2001-297976 | 10/2001 |
| JP | A-2001-304332 | 10/2001 |
| JP | A-2001-307982 | 11/2001 |
| JP | A-2001-307983 | 11/2001 |
| JP | A-2001-313250 | 11/2001 |
| JP | A-2001-338868 | 12/2001 |
| JP | A-2001-345262 | 12/2001 |
| JP | A-2002-14005 | 1/2002 |
| JP | A-2002-15978 | 1/2002 |
| JP | A-2002-16124 | 1/2002 |
| JP | A-2002-43213 | 2/2002 |
| JP | A-2002-57097 | 2/2002 |
| JP | A-2002-66428 | 3/2002 |
| JP | A-2002-71513 | 3/2002 |
| JP | A-2002-75816 | 3/2002 |
| JP | A-2002-91922 | 3/2002 |
| JP | A-2002-93686 | 3/2002 |
| JP | A-2002-93690 | 3/2002 |
| JP | A-2002-100561 | 4/2002 |
| JP | A-2002-118058 | 4/2002 |
| JP | A-2002-141270 | 5/2002 |
| JP | A-2002-158157 | 5/2002 |
| JP | A-2002-170495 | 6/2002 |
| JP | A-2002-190438 | 7/2002 |
| JP | A-2002-195912 | 7/2002 |
| JP | A-2002-198284 | 7/2002 |
| JP | A-2002-202221 | 7/2002 |
| JP | A-2002-203763 | 7/2002 |
| JP | A-2002-208562 | 7/2002 |
| JP | A-2002-520810 | 7/2002 |
| JP | A-2002-222754 | 8/2002 |
| JP | A-2002-227924 | 8/2002 |
| JP | A-2002-231619 | 8/2002 |
| JP | A-2002-258487 | 9/2002 |
| JP | A-2002-261004 | 9/2002 |
| JP | A-2002-263553 | 9/2002 |
| JP | A-2002-277742 | 9/2002 |
| JP | A-2002-289505 | 10/2002 |
| JP | A-2002-305140 | 10/2002 |
| JP | A-2002-323658 | 11/2002 |
| JP | A-2002-324743 | 11/2002 |
| JP | A-2002-329651 | 11/2002 |
| JP | A-2002-334836 | 11/2002 |
| JP | A-2002-353105 | 12/2002 |
| JP | A-2002-357715 | 12/2002 |
| JP | A-2002-359174 | 12/2002 |
| JP | A-2002-362737 | 12/2002 |
| JP | A-2002-365783 | 12/2002 |
| JP | A-2002-367523 | 12/2002 |
| JP | A-2002-367886 | 12/2002 |
| JP | A-2002-373849 | 12/2002 |
| JP | A-2003-15040 | 1/2003 |
| JP | A-2003-17003 | 1/2003 |
| JP | A-2003-17404 | 1/2003 |
| JP | A-2003-022967 | 1/2003 |
| JP | A-2003-28673 | 1/2003 |
| JP | A-2003-35822 | 2/2003 |
| JP | A-2003-43223 | 2/2003 |
| JP | A-2003-45219 | 2/2003 |
| JP | A-2003-45712 | 2/2003 |
| JP | A-2003-59286 | 2/2003 |
| JP | A-2003-59803 | 2/2003 |
| JP | A-2003-59821 | 2/2003 |
| JP | A-2003-68600 | 3/2003 |
| JP | A-2003-75703 | 3/2003 |
| JP | A-2003-81654 | 3/2003 |
| JP | A-2003-84445 | 3/2003 |
| JP | A-2003-98651 | 4/2003 |
| JP | A-2003-100597 | 4/2003 |
| JP | A-2003-114387 | 4/2003 |
| JP | A-2003-124095 | 4/2003 |
| JP | A-2003-130132 | 5/2003 |
| JP | A-2003-133201 | 5/2003 |
| JP | A-2003-149363 | 5/2003 |
| JP | A-2003-151880 | 5/2003 |
| JP | A-2003-161882 | 6/2003 |
| JP | A-2003-163158 | 6/2003 |
| JP | A-2003-166856 | 6/2003 |
| JP | A2003-173957 | 6/2003 |
| JP | A-2003-188087 | 7/2003 |
| JP | A-2003-195223 | 7/2003 |
| JP | A-2003-224961 | 8/2003 |
| JP | A-2003-229347 | 8/2003 |
| JP | A-2003-233001 | 8/2003 |
| JP | A-2003-238577 | 8/2003 |
| JP | A-2003-240906 | 8/2003 |
| JP | A-2003-249443 | 9/2003 |
| JP | A-2003-258071 | 9/2003 |
| JP | A-2003-262501 | 9/2003 |
| JP | A-2003-263119 | 9/2003 |
| JP | A-2003-272837 | 9/2003 |

(56) References Cited

FOREIGN PATENT DOCUMENTS

| | | |
|---|---|---|
| JP | A-2003-273338 | 9/2003 |
| JP | A-2003-279889 | 10/2003 |
| JP | A-2003-282423 | 10/2003 |
| JP | A-2003-297727 | 10/2003 |
| JP | A-2003-523281 | 10/2003 |
| JP | A-2003-532281 | 10/2003 |
| JP | A-2003-532282 | 10/2003 |
| JP | A-2003-311923 | 11/2003 |
| JP | A-2004-006440 | 1/2004 |
| JP | A-2004-7417 | 1/2004 |
| JP | A-2004-14642 | 1/2004 |
| JP | A-2004-14876 | 1/2004 |
| JP | A-2004-15187 | 1/2004 |
| JP | A-2004-22708 | 1/2004 |
| JP | A-2004-38247 | 2/2004 |
| JP | A-2004-39952 | 2/2004 |
| JP | A-2004-40039 | 2/2004 |
| JP | A-2004-45063 | 2/2004 |
| JP | A-2004-63847 | 2/2004 |
| JP | A-2004-71851 | 3/2004 |
| JP | A-2004-85612 | 3/2004 |
| JP | A-2004-87987 | 3/2004 |
| JP | A-2004-093624 | 3/2004 |
| JP | A-2004-95653 | 3/2004 |
| JP | U-3102327 | 3/2004 |
| JP | A-2001-23996 | 4/2004 |
| JP | A-2004-98012 | 4/2004 |
| JP | A-2004-101362 | 4/2004 |
| JP | A-2004-103674 | 4/2004 |
| JP | A-2004-103858 | 4/2004 |
| JP | A-2004-111569 | 4/2004 |
| JP | A-2004-111579 | 4/2004 |
| JP | A-2004-119497 | 4/2004 |
| JP | A-2004-119717 | 4/2004 |
| JP | A-2004-128307 | 4/2004 |
| JP | A-2004-134682 | 4/2004 |
| JP | A-2004-140145 | 5/2004 |
| JP | A-2004-145269 | 5/2004 |
| JP | A-2004-146702 | 5/2004 |
| JP | A-2004-152705 | 5/2004 |
| JP | A-2004-153064 | 5/2004 |
| JP | A-2004-153096 | 5/2004 |
| JP | A-2004-163555 | 6/2004 |
| JP | A-2004-165249 | 6/2004 |
| JP | A-2004-165416 | 6/2004 |
| JP | A-2004-172471 | 6/2004 |
| JP | A-2004-177468 | 6/2004 |
| JP | A-2004-179172 | 6/2004 |
| JP | A-2004-187401 | 7/2004 |
| JP | A-2004-191660 | 7/2004 |
| JP | A-2004-193252 | 7/2004 |
| JP | A-2004-193425 | 7/2004 |
| JP | A-2004-198748 | 7/2004 |
| JP | A-2004-205698 | 7/2004 |
| JP | A-2004-206115 | 7/2004 |
| JP | A-2004-207696 | 7/2004 |
| JP | A-2004-207711 | 7/2004 |
| JP | A-2004-221253 | 8/2004 |
| JP | A-2004-224421 | 8/2004 |
| JP | A-2004-228497 | 8/2004 |
| JP | A-2004-233897 | 8/2004 |
| JP | A-2004-241666 | 8/2004 |
| JP | A-2004-247527 | 9/2004 |
| JP | A-2004-259828 | 9/2004 |
| JP | A-2004-259966 | 9/2004 |
| JP | A-2004-259985 | 9/2004 |
| JP | A-2004-260043 | 9/2004 |
| JP | A-2004-260081 | 9/2004 |
| JP | A-2004-294202 | 10/2004 |
| JP | A-2004-301825 | 10/2004 |
| JP | A-2004-302043 | 10/2004 |
| JP | A-2004-303808 | 10/2004 |
| JP | A-2004-304135 | 10/2004 |
| JP | A-2004-307264 | 11/2004 |
| JP | A-2004-307265 | 11/2004 |
| JP | A-2004-307266 | 11/2004 |
| JP | A-2004-307267 | 11/2004 |
| JP | A-2004-319724 | 11/2004 |
| JP | A-2004-320017 | 11/2004 |
| JP | A-2004-327660 | 11/2004 |
| JP | A-2004-335808 | 11/2004 |
| JP | A-2004-335864 | 11/2004 |
| JP | A-2004-336922 | 11/2004 |
| JP | A-2004-342987 | 12/2004 |
| JP | A-2004-349645 | 12/2004 |
| JP | A-2004-356410 | 12/2004 |
| JP | A-2005-5295 | 1/2005 |
| JP | A-2005-5395 | 1/2005 |
| JP | A-2005-5521 | 1/2005 |
| JP | A-2005-005521 | 1/2005 |
| JP | A-2005-11990 | 1/2005 |
| JP | A-2005-12228 | 1/2005 |
| JP | A-2005-018013 | 1/2005 |
| JP | A-2005-19628 | 1/2005 |
| JP | A-2005-19864 | 1/2005 |
| JP | A-2005-26634 | 1/2005 |
| JP | A-2005-503018 | 1/2005 |
| JP | A-2005-032909 | 2/2005 |
| JP | A-2005-51147 | 2/2005 |
| JP | A-2005-55811 | 3/2005 |
| JP | A-2005-64210 | 3/2005 |
| JP | A-2005-64391 | 3/2005 |
| JP | A-2005-79222 | 3/2005 |
| JP | A-2005-79584 | 3/2005 |
| JP | A-2005-79587 | 3/2005 |
| JP | A-2005-86148 | 3/2005 |
| JP | A-2005-91023 | 4/2005 |
| JP | A-2005-93324 | 4/2005 |
| JP | A-2005-93948 | 4/2005 |
| JP | A-2005-97057 | 4/2005 |
| JP | A-2005-108934 | 4/2005 |
| JP | A-2005-114882 | 4/2005 |
| JP | A-2005-116570 | 4/2005 |
| JP | A-2005-116571 | 4/2005 |
| JP | A-2005-116831 | 4/2005 |
| JP | A-2005-123586 | 5/2005 |
| JP | A-2005-127460 | 5/2005 |
| JP | A-2005-136404 | 5/2005 |
| JP | A-2005-136422 | 5/2005 |
| JP | A-2005-140999 | 6/2005 |
| JP | A-2005-150759 | 6/2005 |
| JP | A-2005-156592 | 6/2005 |
| JP | A-2005-166871 | 6/2005 |
| JP | A-2005-175176 | 6/2005 |
| JP | A-2005-175177 | 6/2005 |
| JP | A-2005-191344 | 7/2005 |
| JP | A-2005-203483 | 7/2005 |
| JP | A-2005-209705 | 8/2005 |
| JP | A-2005-209706 | 8/2005 |
| JP | A-2005-223328 | 8/2005 |
| JP | A-2005-233979 | 9/2005 |
| JP | A-2005-234359 | 9/2005 |
| JP | A-2005-236088 | 9/2005 |
| JP | A-2005-243770 | 9/2005 |
| JP | A-2005-243870 | 9/2005 |
| JP | A-2005-243904 | 9/2005 |
| JP | A-2005-251549 | 9/2005 |
| JP | A-2005-257740 | 9/2005 |
| JP | A-2005-259789 | 9/2005 |
| JP | A-2005-259830 | 9/2005 |
| JP | A-2005-268700 | 9/2005 |
| JP | A-2005-268741 | 9/2005 |
| JP | A-2005-268742 | 9/2005 |
| JP | A-2005-276932 | 10/2005 |
| JP | A-2005-302825 | 10/2005 |
| JP | A-2005-303167 | 10/2005 |
| JP | A-2005-311020 | 11/2005 |
| JP | A-2005-315918 | 11/2005 |
| JP | A-2005-340605 | 12/2005 |
| JP | A-2005-366813 | 12/2005 |
| JP | A-2005-537658 | 12/2005 |
| JP | A-2006-1821 | 1/2006 |
| JP | A-2006-5197 | 1/2006 |
| JP | A-2006-013518 | 1/2006 |

(56) References Cited

FOREIGN PATENT DOCUMENTS

| | | |
|---|---|---|
| JP | A-2006-17895 | 1/2006 |
| JP | A-2006-19702 | 1/2006 |
| JP | A-2006-24706 | 1/2006 |
| JP | A-2006-24819 | 1/2006 |
| JP | A-2006-32750 | 2/2006 |
| JP | A-2006-032963 | 2/2006 |
| JP | A-2006-41302 | 2/2006 |
| JP | A-2006-054328 | 2/2006 |
| JP | A-2006-54364 | 2/2006 |
| JP | A-2006-73584 | 3/2006 |
| JP | A-2006-73951 | 3/2006 |
| JP | A-2006-80281 | 3/2006 |
| JP | A-2006-86141 | 3/2006 |
| JP | A-2006-86442 | 3/2006 |
| JP | A-2006-508369 | 3/2006 |
| JP | A-2006-100363 | 4/2006 |
| JP | A-2006-100686 | 4/2006 |
| JP | A-2006-113437 | 4/2006 |
| JP | A-2006-513442 | 4/2006 |
| JP | A-2006-120985 | 5/2006 |
| JP | A-2006-128192 | 5/2006 |
| JP | A-2006-135165 | 5/2006 |
| JP | A-2006-135312 | 5/2006 |
| JP | A-2006-140366 | 6/2006 |
| JP | A-2006-170811 | 6/2006 |
| JP | A-2006-170899 | 6/2006 |
| JP | A-2006-177865 | 7/2006 |
| JP | A-2006-184414 | 7/2006 |
| JP | A-2006-194665 | 7/2006 |
| JP | A-2006-516724 | 7/2006 |
| JP | A-2006-228718 | 8/2006 |
| JP | A-2006-519494 | 8/2006 |
| JP | A-2006-250587 | 9/2006 |
| JP | A-2006-253572 | 9/2006 |
| JP | A-2006-269762 | 10/2006 |
| JP | A-2006-278820 | 10/2006 |
| JP | A-2006-284740 | 10/2006 |
| JP | A-2006-289684 | 10/2006 |
| JP | A-2006-309243 | 11/2006 |
| JP | A-2006-344747 | 12/2006 |
| JP | A-2006-349946 | 12/2006 |
| JP | A-2006-351586 | 12/2006 |
| JP | A-2007-5830 | 1/2007 |
| JP | A-2007-019079 | 1/2007 |
| JP | A-2007-43980 | 2/2007 |
| JP | A-2007-48819 | 2/2007 |
| JP | A-2007-51300 | 3/2007 |
| JP | A-2007-505488 | 3/2007 |
| JP | A-2007-87306 | 4/2007 |
| JP | A-2007-93546 | 4/2007 |
| JP | A-2007-103153 | 4/2007 |
| JP | A-2007-113939 | 5/2007 |
| JP | A-2007-119851 | 5/2007 |
| JP | A-2007-120333 | 5/2007 |
| JP | A-2007-120334 | 5/2007 |
| JP | A-2007-142313 | 6/2007 |
| JP | A-2007-144864 | 6/2007 |
| JP | A-2007-150295 | 6/2007 |
| JP | A-2007-170938 | 7/2007 |
| JP | A-2007-187649 | 7/2007 |
| JP | A-2007-207821 | 8/2007 |
| JP | A-2007-227637 | 9/2007 |
| JP | A-2007-227918 | 9/2007 |
| JP | A-2007-235041 | 9/2007 |
| JP | A-2007-258691 | 10/2007 |
| JP | A-2007-274881 | 10/2007 |
| JP | A-2007-280623 | 10/2007 |
| JP | A-2007-295702 | 11/2007 |
| JP | A-2008-3740 | 1/2008 |
| JP | A-2008-047744 | 2/2008 |
| JP | A-2008-58580 | 3/2008 |
| JP | A-2008-64924 | 3/2008 |
| JP | A-2008-102134 | 5/2008 |
| JP | A-2008-103737 | 5/2008 |
| JP | A-2008-180492 | 8/2008 |
| JP | A-2008-258605 | 10/2008 |
| JP | A-2009-17540 | 1/2009 |
| JP | A-2009-60339 | 3/2009 |
| JP | A-2009-105396 | 5/2009 |
| JP | A-2009-111369 | 5/2009 |
| JP | A-2009-117801 | 5/2009 |
| JP | A-2009-117812 | 5/2009 |
| JP | A-2010-034486 | 2/2010 |
| JP | 5 141 491 B2 | 11/2012 |
| KR | 10-2002-0092207 | 12/2002 |
| KR | 10-2006-0118435 | 11/2006 |
| KR | 10-2007-0087507 | 8/2007 |
| TW | 497365 | 8/2002 |
| TW | 200400540 | 1/2004 |
| TW | I-267694 | 12/2006 |
| WO | WO 97/11411 A1 | 3/1997 |
| WO | WO 98/24115 A1 | 6/1998 |
| WO | WO 98/59364 A1 | 12/1998 |
| WO | WO 99/23692 A1 | 5/1999 |
| WO | WO 99/27568 A1 | 6/1999 |
| WO | WO 99/31716 A1 | 6/1999 |
| WO | WO 99/34255 A1 | 7/1999 |
| WO | WO 99/49366 A1 | 9/1999 |
| WO | WO 99/049504 A1 | 9/1999 |
| WO | WO 99/49504 A1 | 9/1999 |
| WO | WO 99/50712 A1 | 10/1999 |
| WO | WO 99/66370 A1 | 12/1999 |
| WO | WO 00/11706 A1 | 3/2000 |
| WO | WO 00/67303 | 4/2000 |
| WO | WO 00/67303 | 11/2000 |
| WO | WO 01/03170 A1 | 1/2001 |
| WO | WO 01/10137 A1 | 2/2001 |
| WO | WO 01/22480 A1 | 3/2001 |
| WO | WO 01/27978 A1 | 4/2001 |
| WO | WO 01/59502 A1 | 8/2001 |
| WO | WO 01/65296 A1 | 9/2001 |
| WO | WO 02/16993 A1 | 2/2002 |
| WO | WO 02/063664 A1 | 8/2002 |
| WO | WO 02/069094 A2 | 9/2002 |
| WO | WO 02/080185 A1 | 10/2002 |
| WO | WO 02/084720 A2 | 10/2002 |
| WO | WO 02/084850 A1 | 10/2002 |
| WO | WO 02/101804 A1 | 12/2002 |
| WO | WO 02/103766 A1 | 12/2002 |
| WO | WO 03/023832 A1 | 3/2003 |
| WO | WO 03/023833 A1 | 3/2003 |
| WO | WO 03/063212 A1 | 7/2003 |
| WO | WO 03/077036 A1 | 9/2003 |
| WO | WO 03/085708 A1 | 10/2003 |
| WO | WO 2004/051220 A2 | 6/2004 |
| WO | WO 2004/051717 A1 | 6/2004 |
| WO | WO 2004/053596 A2 | 6/2004 |
| WO | WO 2004/053950 A1 | 6/2004 |
| WO | WO 2004/053951 A1 | 6/2004 |
| WO | WO2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/061488 A1 | 7/2004 |
| WO | WO 2004/071070 A2 | 8/2004 |
| WO | WO 2004/077164 A1 | 9/2004 |
| WO | WO 2004/086468 A1 | 10/2004 |
| WO | WO 2004/086470 A1 | 10/2004 |
| WO | WO 2004/090956 A1 | 10/2004 |
| WO | WO 2004/091079 A1 | 10/2004 |
| WO | WO 2004/094940 A1 | 11/2004 |
| WO | WO 2004/104654 A1 | 12/2004 |
| WO | WO 2004/105106 A1 | 12/2004 |
| WO | WO 2004/105107 A1 | 12/2004 |
| WO | WO 2004/107048 A2 | 12/2004 |
| WO | WO 2004/107417 A1 | 12/2004 |
| WO | WO 2004/109780 A1 | 12/2004 |
| WO | WO 2004/114380 A1 | 12/2004 |
| WO | WO 2005/006415 A1 | 1/2005 |
| WO | WO 2005/006418 A1 | 1/2005 |

(56) References Cited

FOREIGN PATENT DOCUMENTS

| | | |
|---|---|---|
| WO | WO 2005/008754 A1 | 1/2005 |
| WO | WO 2005/022615 A1 | 3/2005 |
| WO | WO 2005/026843 A2 | 3/2005 |
| WO | WO 2005/029559 A1 | 3/2005 |
| WO | WO 2005/036619 A1 | 4/2005 |
| WO | WO 2005/036620 A1 | 4/2005 |
| WO | WO 2005-036622 A1 | 4/2005 |
| WO | WO 2005-036623 A1 | 4/2005 |
| WO | WO 2005/041276 A1 | 5/2005 |
| WO | WO 2005/048325 A1 | 5/2005 |
| WO | WO 2005/048326 A1 | 5/2005 |
| WO | WO 2005/057636 A1 | 6/2005 |
| WO | WO 2005/067013 A1 | 7/2005 |
| WO | WO 2005/071717 A1 | 8/2005 |
| WO | WO 2005/076321 A1 | 8/2005 |
| WO | WO 2005/076323 A1 | 8/2005 |
| WO | WO 2005/081291 A1 | 9/2005 |
| WO | WO 2005/081292 A1 | 9/2005 |
| WO | WO 2005/104195 A1 | 11/2005 |
| WO | WO 2006-006730 A1 | 1/2006 |
| WO | WO 2006-016551 A1 | 2/2006 |
| WO | WO 2006/019124 A1 | 2/2006 |
| WO | WO 2006-025341 A1 | 3/2006 |
| WO | WO 2006-028188 A1 | 3/2006 |
| WO | WO 2006-030727 A1 | 3/2006 |
| WO | WO 2006/030910 A1 | 3/2006 |
| WO | WO 2006-035775 A1 | 4/2006 |
| WO | WO 2006-049134 A1 | 5/2006 |
| WO | WO 2006/051909 A1 | 5/2006 |
| WO | WO 2006-064851 A1 | 6/2006 |
| WO | WO 2006-068233 A1 | 6/2006 |
| WO | WO 2006-077958 A1 | 7/2006 |
| WO | WO 2006/085524 A1 | 8/2006 |
| WO | WO 2006/085626 A1 | 8/2006 |
| WO | 2006/097101 A1 | 9/2006 |
| WO | WO 2006/097135 A1 | 9/2006 |
| WO | WO 2006/100889 A1 | 9/2006 |
| WO | WO 2006-118108 A1 | 11/2006 |
| WO | WO 2007/003563 A1 | 1/2007 |
| WO | WO 2007/004567 A1 | 1/2007 |
| WO | WO 2007-018127 A1 | 2/2007 |
| WO | WO 2007/055237 A1 | 5/2007 |
| WO | WO 2007/055373 A1 | 5/2007 |
| WO | WO 2007/058188 A1 | 5/2007 |
| WO | WO 2007/066692 A1 | 6/2007 |
| WO | WO 2007/066758 A1 | 6/2007 |
| WO | WO 2007/100081 A1 | 7/2007 |
| WO | WO 2007/097198 A1 | 8/2007 |
| WO | WO 2007/132862 A1 | 11/2007 |
| WO | WO 2007/141997 A1 | 12/2007 |
| WO | WO 2008/015973 A1 | 2/2008 |
| WO | WO 2008/041575 A1 | 4/2008 |
| WO | WO 2008/059748 A1 | 5/2008 |
| WO | WO 2008/061681 A2 | 5/2008 |
| WO | WO 2006-343023 | 6/2008 |
| WO | WO 2008/065977 A1 | 6/2008 |
| WO | WO 2008/075613 A1 | 6/2008 |
| WO | WO 2008/078688 A1 | 7/2008 |
| WO | WO 2008/090975 A1 | 7/2008 |
| WO | WO 2008/131928 A1 | 11/2008 |
| WO | WO 2008/139848 A1 | 11/2008 |
| WO | WO 2009/026947 A1 | 3/2009 |
| WO | WO 2009/034109 A2 | 3/2009 |
| WO | WO 2009/054541 A2 | 4/2009 |
| WO | WO 2009/153925 A1 | 12/2009 |
| WO | WO 2009/157154 A1 | 12/2009 |
| WO | WO 2010/001537 A1 | 1/2010 |

OTHER PUBLICATIONS

Nov. 19, 2013 Office Action issued in Japanese Patent Application No. P2012-080374 (with translation).
Nov. 22, 2013 Office Action issued in Taiwanese Patent Application No. 097135029 (with translation).
Jun. 18, 2012 Office Action issued in Chinese Patent Application No. 200880021453.5 (with translation).
Aug. 14, 2012 Notice of Allowance issued in U.S. Appl. No. 12/252,274.
Aug. 24, 2012 Office Action issued in U.S. Appl. No. 12/245,021.
Aug. 27, 2012 Office Action issued in U.S. Appl. No. 12/256,055.
Jul. 26, 2012 Office Action issued in Chinese Application No. 200880020867.6.
Sep. 18, 2013 Office Action issued in U.S. Appl. No. 13/866,447.
Sep. 21, 2012 Search Report issued in European Application No. 12173801.7.
Oct. 23, 2012 Notice of Allowance issued in Japanese Application No. P2008-263405 (w/ translation).
Nov. 5, 2013 Notice of Allowance issued in Japanese Patent Application No. P2008-226683 (with translation).
Oct. 11, 2013 Office Action issued in Chinese Patent Application No. 2011-10307567.X (with translation).
May 10, 2013 Office Action issued in European Patent Application No. 12171299.6.
Apr. 3, 2013 Office Action issued in Chinese Patent Application No. 200880100940.0 (with translation).
Oct. 2, 2012 Search Report issued in European Application No. 12173803.3.
Sep. 28, 2012 Notice of Allowance issued in U.S. Appl. No. 12/252,283.
Nov. 20, 2012 Office Action issued in Japanese Application No. P2008-261214 (w/ translation).
Nov. 20, 2012 Office Action issued in Japanese Application No. P2008-261215 (w/ translation).
Nov. 27, 2012 Office Action issued in U.S. Appl. No. 12/252,274.
Dec. 26, 2012 Office Action in Chinese Patent Application No. 200980101546.3 (with translation).
May 29, 2012 Office Action issued in U.S. Appl. No. 13/417,602.
Feb. 22, 2012 Chinese Office Action issued in Chinese Application No. 200880020867.6 (with translation).
May 9, 2012 European Office Action issued in European Application No. 08 830 323.5.
May 23, 2012 Notice of Allowance issued in U.S. Appl. No. 12/191,821.
Jul. 16, 2013 Japanese Office Action issued in Japanese Patent Application No. 2008-226683 (with translation).
Jul. 23, 2013 Office Action issued in U.S. Appl. No. 13/866,447.
Jul. 29, 2013 Search Report issued in European Patent Application No. 13156736.4.
Jan. 16, 2013 Notice of Allowance issued in U.S. Appl. No. 13/417,602.
Jan. 23, 2013 Notice of Allowance issued in U.S. Appl. No. 12/252,283.
Jan. 23, 2013 Notice of Allowance issued in U.S. Appl. No. 12/952,197.
Sep. 14, 2012 Office Action issued in U.S. Appl. No. 13/484,051.
Oct. 18, 2012 Search Report issued in European Application No. 09015718.1.
Oct. 30, 2012 Search Report issued in European Application No. 12173802.5.
Oct. 17, 2012 Office Action issued in European Application No. 09015716.5.
Oct. 10, 2012 Office Action issued in Chinese Application No. 200880015567.9 (w/ translation).
Mar. 12, 2013 Office Action issued in Chinese Patent Application No. 200880024806.7 (with translation).
Apr. 5, 2013 Notice of Allowance issued in U.S. Appl. No. 13/484,051.
Apr. 29, 2013 Notice of Allowance issued in U.S. Appl. No. 12/252,274.
Jun. 20, 2012 Office Action issued in Chinese Patent Application No. 200880100940.0 (with translation).
Jul. 17, 2012 Office Action issued in U.S. Appl. No. 12/250,519.
Jul. 27, 2012 Search Report issued in European Patent Application No. 12171299.6.
Jan. 15, 2013 Office Action issued in Japanese Patent Application No. P2008-259522 (with translation).

(56) References Cited

OTHER PUBLICATIONS

Jan. 15, 2013 Notice of Allowance issued in U.S. Appl. No. 12/191,821.
Jan. 31, 2013 Office Action issued in Chinese Patent Application No. 200880021453.5 (with translation).
Feb. 19, 2013 Office Action issued in Japanese Patent Application No. 2010-514429 (with translation).
Mar. 11, 2013 Office Action issued in European Patent Application No. 08 847 031.5.
Mar. 19, 2013 Office Action issued in European Patent Application No. 08 830 323.5.
Dec. 24, 2013 Office Action issued in Taiwanese Patent Application No. 097140577 (with English Translation).
Jan. 15, 2009 International Search Report issued in International Application No. PCT/JP2008/068319.
Mar. 25, 2009 International Search Report issued in International Application No. PCT/JP2008/066803.
Jan. 16, 2009 Invitation to Pay Additional Fees Relating to the results of the Partial International Search Report issued in International Application No. PCT/JP2008/066803.
May 25, 2009 International Search Report issued in International Application No. PCT/JP2008/069704.
Mar. 6, 2009 Invitation to Pay Additional Fees Relating to the results of the Partial International Search Report issued in International Application No. PCT/JP2008/069704.
Jan. 26, 2009 International Search Report issued in International Application No. PCT/JP2008/068909.
Apr. 6, 2009 International Search Report issued in International Application No. PCT/JP2008/070253.
Mar. 2, 2009 International Search Report issued in International Application No. PCT/JP2008/069701.
Dec. 9, 2010 European Search Report issued in European Application No. 09015719.9.
Dec. 9, 2010 European Search Report issued in European Application No. 09015716.5.
Dec. 9, 2010 Partial European Search Report issued in European Application No. 09015718.1.
Oct. 15, 2010 Office Action issued in European Application No. 08 835 135.8.
Feb. 22, 2011 Office Action issued in European Application No. 08 830 323.5.
Dec. 8, 2010 Office Action issued in European Application No. 08 841 021.2.
Jun. 25, 2010 Office Action issued in European Application No. 08 837 064.8.
Mar. 24, 2011 Office Action issued in Chinese Application No. 200880024806.7 (with translation).
Jul. 5, 2011 Office Action issued in Chinese Application No. 200880100940.0 (with translation).
Jul. 12, 2011 Office Action issued in Chinese Patent Application No. 200880018312.8 (with translation).
Jun. 30, 2011 Office Action issued in Chinese Patent Application No. 200880021453.5 (with translation).
Jul. 26, 2011 Office Action issued in Chinese Patent Application No. 200880020867.6 (with translation).
Feb. 20, 2012 Second Office Action issued in Chinese Patent Application No. 200880018312.8 (with translation).
May 18, 2011 Office Action issued in U.S. Appl. No. 12/208,155.
Jul. 27, 2011 Office Action issued in U.S. Appl. No. 12/208,155.
Mar. 24, 2011 Office Action issued in U.S. Appl. No. 12/191,821.
Jul. 19, 2011 Office Action issued in U.S. Appl. No. 12/191,821.
Aug. 26, 2011 Office Action issued in U.S. Appl. No. 12/245,021.
Jul. 18, 2011 Office Action issued in U.S. Appl. No. 12/250,519.
Jan. 3, 2011 Office Action issued in U.S. Appl. No. 12/262,930.
May 13, 2011 Office Action issued in U.S. Appl. No. 12/952,197.
Mar. 31, 2011 Notice of Allowance issued in U.S. Appl. No. 12/252,274.
Sep. 1, 2010 Office Action issued in U.S. Appl. No. 12/252,274.
Jul. 28, 2011 Office Action issued in U.S. Appl. No. 12/252,283.
Feb. 24, 2012 Notice of Allowance issued in U.S. Appl. No. 12/252,283.
Gao et al., "Research on high-quality projecting reduction lithography system based on digital mask technique", Aug. 17, 2005, vol. 116, No. 7, pp. 303-310.
Nov. 7, 2011 Office Action issued in U.S. Appl. No. 12/250,519.
Nov. 28, 2011 Notice of Allowance issued in U.S. Appl. No. 12/952,197.
Nov. 15, 2011 Office Action issued in U.S. Appl. No. 12/252,274.
Dec. 8, 2011 Office Action issued in U.S. Appl. No. 12/256,055.
Nov. 3, 2011 Office Action issued in Chinese Patent Application No. 200880015567.9.
Dec. 12, 2011 Office Action issued in European Patent Application No. 08 837 064.8.
Nov. 17, 2011 Office Action issued in Chinese Patent Application No. 200880024375.4.
Dec. 20, 2011 Office Action issued in Chinese Patent Application No. 200980101546.3 (with translation).
Feb. 7, 2012 Notice of Allowance issued in U.S. Appl. No. 12/191,821.
May 8, 2014 Office Action issued in European Patent Application No. 13156736.4.
Dec. 18, 2012 Office Action issued in U.S. Appl. No. 12/250,519.
Oct. 17, 2012 Office Action issued in European Patent Application No. 08841021.2.
Jun. 17, 2013 Office Action issued in European Patent Application No. 12 173 802.5.
Aug. 27, 2014 Office Action issued in Korean Patent Application No. 10-2010-7011180 (with English translation).
Jul. 15, 2014 Office Action issued in Korean Patent Application No. 10-2010-7008059 (with English Translation).
Jul. 22, 2014 Office Action issued in Chinese Patent Application No. 201110307567.X (with English Translation).
Jul. 18, 2014 European Search Report issued in European Patent Application No. 12197226.9.
Jul. 18, 2014 European Search Report issued in European Patent Application No. 12197228.5.
Jul. 18, 2014 European Search Report issued in European Patent Application No. 12197227.7.
Nov. 26, 2014 Office Action issued in Korean Application No. 10-2013-7027738.
Feb. 3, 2015 Office Action issued in European Patent Application No. 13156736.4.
Jan. 23, 2015 Office Action issued in Taiwanese Patent Application No. 101144123.
Mar. 31, 2015 Office Action issued in Korean Application No. 10-2014-7024048.

\* cited by examiner

Fig.5
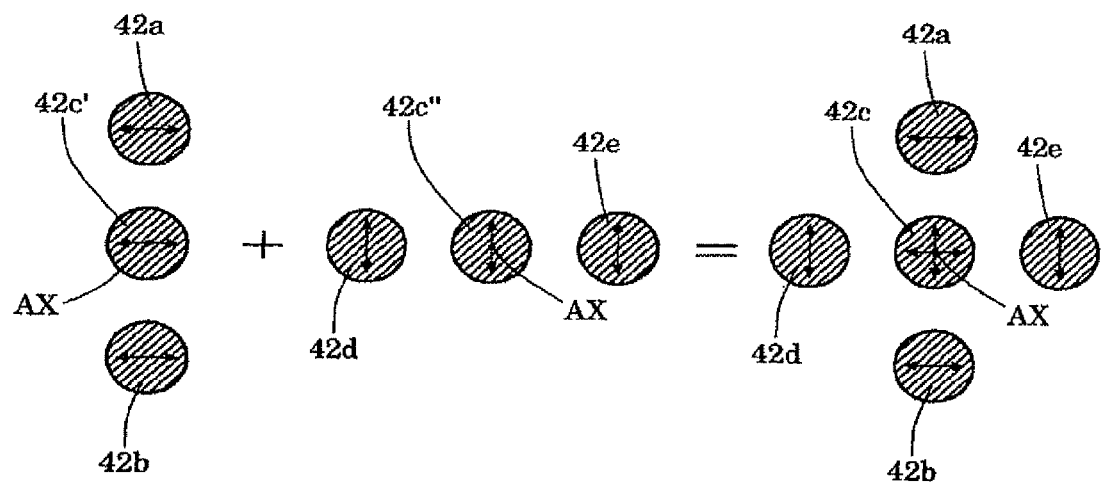
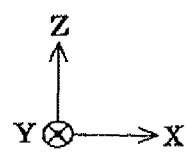

OPTICAL UNIT, ILLUMINATION OPTICAL APPARATUS, EXPOSURE APPARATUS, AND DEVICE MANUFACTURING METHOD

CROSS-REFERENCE TO RELATED APPLICATIONS

This is a Division of application Ser. No. 12/245,021 filed Oct. 3, 2008, now U.S. Pat. No. 8,379,187 which claims the benefit of U.S. Provisional Application No. 61/006,446 filed Jan. 14, 2008 and U.S. Provisional Application No. 60/960,996, filed on Oct. 24, 2007, each of which are incorporated by reference in their entirety.

BACKGROUND OF THE INVENTION

1. Field

An embodiment of the present invention relates to an optical unit, an illumination optical apparatus, an exposure apparatus, and a device manufacturing method.

2. Description of the Related Art

In a typical exposure apparatus of this type, a light beam emitted from a light source travels through a fly's eye lens as an optical integrator to form a secondary light source (a predetermined light intensity distribution on an illumination pupil in general) as a substantial surface illuminant consisting of a large number of light sources. The light intensity distribution on the illumination pupil will be referred to hereinafter as "illumination pupil luminance distribution." The illumination pupil is defined as a position such that an illumination target surface becomes a Fourier transform surface of the illumination pupil by action of an optical system between the illumination pupil and the illumination target surface (a mask or a wafer in the case of the exposure apparatus).

Beams from the secondary light source are condensed by a condenser lens to superposedly illuminate the mask on which a predetermined pattern is formed. Light passing through the mask travels through a projection optical system to be focused on the wafer, whereby the mask pattern is projected (or transferred) onto the wafer to effect exposure thereof. Since the pattern formed on the mask is a highly integrated one, an even illuminance distribution must be obtained on the wafer in order to accurately transfer this fine pattern onto the wafer.

There is a conventionally proposed illumination optical apparatus capable of continuously changing the illumination pupil luminance distribution (and, therefore, the illumination condition) without use of a zoom optical system (cf. Japanese Patent Application Laid-open No. 2002-353105). The illumination optical apparatus disclosed in the Application Laid-open No. 2002-353105 uses a movable multi-mirror composed of a large number of micro mirror elements which are arranged in an array form and angles and directions of inclination of which are individually drive-controlled, and is so configured that an incident beam is divided into beams of small units corresponding to reflecting surfaces of the mirror elements, the beams of small units are folded by the multi-mirror to convert a cross section of the incident beam into a desired shape or a desired size, and, in turn, a desired illumination pupil luminance distribution is realized.

SUMMARY

An embodiment of the present invention provides an illumination optical apparatus capable of realizing illumination conditions of greater variety in terms of the shape and size of the illumination pupil luminance distribution. An embodiment of the present invention provides an exposure apparatus capable of performing good exposure under an appropriate illumination condition realized according to a pattern characteristic, using the illumination optical apparatus capable of realizing the illumination conditions of great variety.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

A first embodiment of the present invention provides an optical unit comprising:

a light splitter to split an incident beam traveling in an incident light path, into a plurality of beams;

a first spatial light modulator which can be arranged in an optical path of a first beam out of the plurality of beams;

a second spatial light modulator which can be arranged in an optical path of a second beam out of the plurality of beams; and a light combiner to combine a beam having passed via the first spatial light modulator, with a beam having passed via the second spatial light modulator, and to direct a resultant beam to an exiting light path;

wherein at least one spatial light modulator out of the first spatial light modulator and the second spatial light modulator has a plurality of optical elements arranged two-dimensionally and controlled individually; and wherein the incident light path on the light splitter side and the exiting light path on the light combiner side extend in the same direction.

A second embodiment of the present invention provides an illumination optical apparatus to illuminate an illumination target surface on the basis of light from a light source, the illumination optical apparatus comprising:

the optical unit of the first aspect; and a distribution forming optical system which forms a predetermined light intensity distribution on an illumination pupil of the illumination optical apparatus, based on the beams having passed via the first and second spatial light modulators.

A third embodiment of the present invention provides an exposure apparatus comprising the illumination optical apparatus of the second aspect for illuminating a predetermined pattern, the exposure apparatus performing exposure of the predetermined pattern on a photosensitive substrate.

A fourth embodiment of the present invention provides a device manufacturing method comprising:

effecting the exposure of the predetermined pattern on the photosensitive substrate, using the exposure apparatus of the third aspect;

developing the photosensitive substrate onto which the pattern has been transferred, to form a mask layer in a shape corresponding to the pattern on a surface of the photosensitive substrate; and processing the surface of the photosensitive substrate through the mask layer.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

FIG. 5 is a drawing schematically showing an example of forming an illumination pupil luminance distribution of a pentapolar shape in the embodiment.

DESCRIPTION

Figure 1:
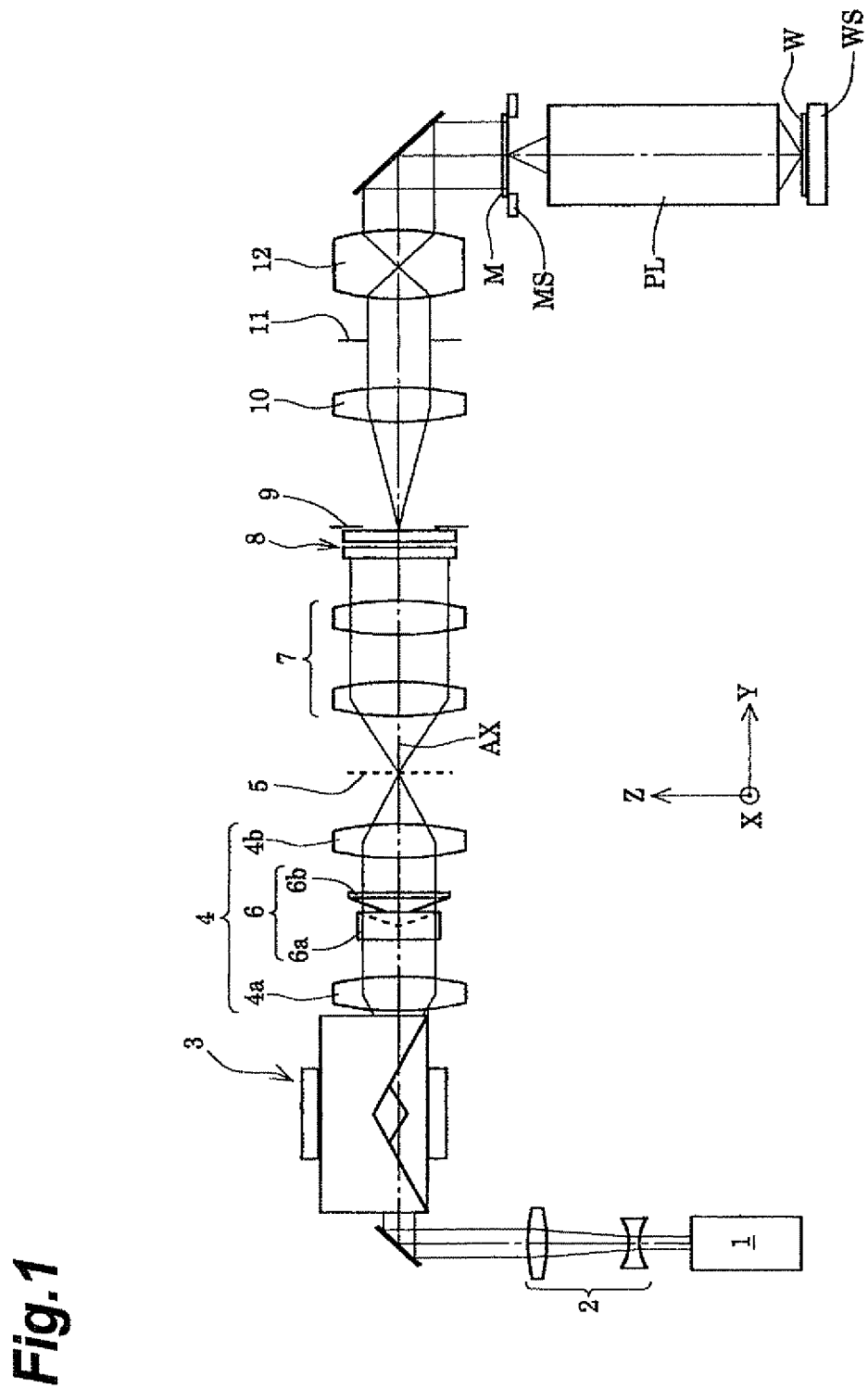
FIG. 1 is a drawing schematically showing a configuration of an exposure apparatus according to an embodiment of the present invention.
Figure 2:
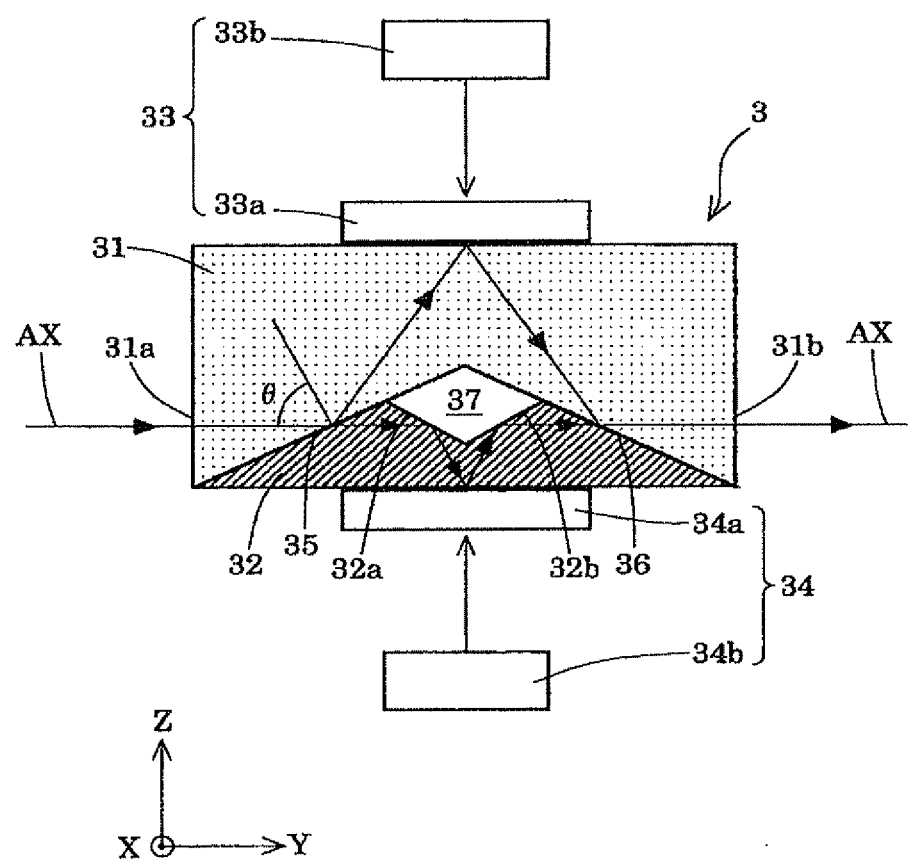
FIG. 2 is a drawing schematically showing a configuration of a spatial light modulation unit.

Embodiments of the present invention will be described on the basis of the accompanying drawings. FIG. 1 is a drawing schematically showing a configuration of an exposure apparatus according to an embodiment of the present invention. FIG. 2 is a drawing schematically showing a configuration of a spatial light modulation unit. In FIG. 1, the Z-axis is set along a direction of a normal to a wafer W being a photosensitive substrate, the Y-axis along a direction parallel to the plane of FIG. 1 in a surface of the wafer W, and the X-axis along a direction perpendicular to the plane of FIG. 1 in the surface of the wafer W.

With reference to FIG. 1, the exposure apparatus of the present embodiment is provided with a light source 1 for supplying exposure light (illumination light). The light source 1 can be, for example, an ArF excimer laser light source which supplies light at the wavelength of 193 nm, or a KrF excimer laser light source which supplies light at the wavelength of 248 nm. Light emitted from the light source 1 is expanded into a beam of a required sectional shape by a shaping optical system 2 and then the expanded beam is incident to a spatial light modulation unit 3.

The spatial light modulation unit 3, as shown in FIG. 2, has a pair of prism members 31 and 32, and a pair of spatial light modulators 33 and 34. The light incident along the optical axis AX into an entrance face 31a of the prism member 31 in the spatial light modulation unit 3 propagates inside the prism member 31 and thereafter impinges upon a polarization separating film 35 formed between the prism members 31 and 32. s-polarized light reflected by the polarization separating film 35 propagates inside the prism member 31 and thereafter impinges upon the first spatial light modulator 33.

The first spatial light modulator 33 has a plurality of mirror elements (optical elements in general) 33a arranged two-dimensionally, and a drive unit 33b (not shown in FIG. 1) which individually controls and drives postures of the mirror elements 33a. Similarly, the second spatial light modulator 34 has a plurality of mirror elements 34a arranged two-dimensionally, and a drive unit 34b (not shown in FIG. 1) which individually controls and drives postures of the mirror elements 34a. The drive units 33b, 34b individually control and drive the postures of the mirror elements 33a, 34a in accordance with commands from an unrepresented control unit.

Light reflected by the mirror elements 33a of the first spatial light modulator 33 propagates inside the prism member 31 and thereafter is incident in the s-polarized state to a polarization separating film 36 formed between the prism members 31 and 32. The light having traveled via the first spatial light modulator 33 to be reflected on the polarization separating film 36, propagates inside the prism member 31 and is then emitted from an exit face 31b of the prism member 31 to the outside of the spatial light modulation unit 3. In a standard state in which reflecting surfaces of all the mirror elements 33a in the first spatial light modulator 33 are positioned along the XY plane, the light having traveled along the optical axis AX into the spatial light modulation unit 3 and then via the first spatial light modulator 33 is emitted along the optical axis AX from the spatial light modulation unit 3.

On the other hand, p-polarized light having passed through the polarization separating film 35 propagates inside the prism member 32 and is totally reflected on an interface 32a between the prism member 32 and a gas (air or inert gas) 37. Thereafter, the totally reflected light is incident to the second spatial light modulator 34. Light reflected by the mirror elements 34a in the second spatial light modulator 34 propagates inside the prism member 32 and is totally reflected on an interface 32b between the prism member 32 and the gas 37. Thereafter, the totally reflected light is incident in the p-polarized state to the polarization separating film 36 formed between the prism members 31 and 32.

The light having traveled via the second spatial light modulator 34 and having been transmitted by the polarization separating film 36, propagates inside the prism member 31 and then is emitted from the exit face 31b of the prism member 31 to the outside of the spatial light modulation unit 3. In a standard state in which reflecting surfaces of all the mirror elements 34a in the second spatial light modulator 34 are positioned along the XY plane, the light having traveled along the optical axis AX into the spatial light modulation unit 3 and then via the second spatial light modulator 34, is emitted along the optical axis AX from the spatial light modulation unit 3.

In the spatial light modulation unit 3, as described above, the polarization separating film 35 formed between the prism members 31 and 32 constitutes a light splitter to split the incident beam into two beams (a plurality of beams in general). The polarization separating film 36 formed between the prism members 31 and 32 constitutes a light combiner to combine the beam having traveled via the first spatial light modulator 33, with the beam having traveled via the second spatial light modulator 34.

The light emitted from the spatial light modulation unit 3 is then incident to an afocal lens 4. The afocal lens 4 is an afocal system (afocal optic) that is so set that the front focal point thereof is approximately coincident with the position of the mirror elements 33a of the first spatial light modulator 33 and with the position of the mirror elements 34a of the second spatial light modulator 34 and that the rear focal point thereof is approximately coincident with a position of a predetermined plane 5 indicated by a dashed line in the drawing.

Therefore, the s-polarized beam having traveled via the first spatial light modulator 33 forms, for example, a light intensity distribution of a Z-directionally dipolar shape consisting of two circular light intensity distributional areas spaced in the Z-direction with a center on the optical axis AX, on the pupil plane of the afocal lens 4, and thereafter is emitted in the dipolar angle distribution from the afocal lens 4. On the other hand, the p-polarized beam having traveled via the second spatial light modulator 34 forms, for example, a light intensity distribution of an X-directionally dipolar shape consisting of two circular light intensity distributional areas spaced in the X-direction with a center on the optical axis AX, on the pupil plane of the afocal lens 4, and thereafter is emitted in the dipolar angle distribution from the afocal lens 4.

A conical axicon system 6 is arranged at the position of the pupil plane of the afocal lens 4 or at a position near it in the optical path between a front lens unit 4a and a rear lens unit 4b of the afocal lens 4. The configuration and action of the conical axicon system 6 will be described later. The beam having passed through the afocal lens 4 travels through a zoom lens 7 for variation in σ value (σ value=mask-side numerical aperture of the illumination optical apparatus/ mask-side numerical aperture of the projection optical system) and then enters a cylindrical micro fly's eye lens 8.

Figure 3:
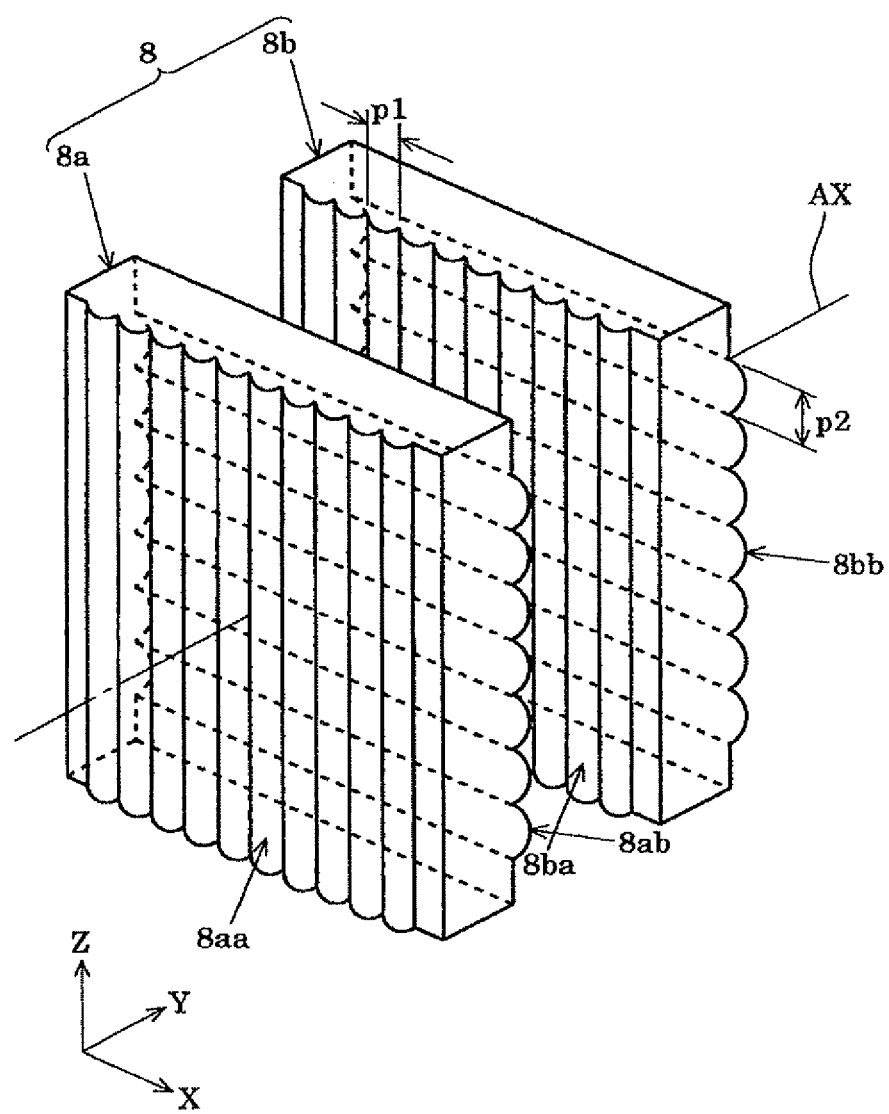
FIG. 3 is a perspective view schematically showing a configuration of a cylindrical micro fly's eye lens.

The cylindrical micro fly's eye lens 8, as shown in FIG. 3, is composed of a first fly's eye member 8a arranged on the light source side and a second fly's eye member 8b arranged on the mask side. Cylindrical lens groups 8aa and 8ba arrayed in the X-direction are formed each at the pitch p1 in the light-source-side surface of the first fly's eye member 8a and in the light-source-side surface of the second fly's eye member 8b, respectively. Cylindrical lens groups 8ab and 8bb arrayed in the Z-direction are formed each at the pitch p2 (p2>p1) in the mask-side surface of the first fly's eye member 8a and in the mask-side surface of the second fly's eye member 8b, respectively.

When attention is focused on the refracting action in the X-direction of the cylindrical micro fly's eye lens 8 (i.e., the refracting action in the KY plane), the wavefront of a parallel beam incident along the optical axis AX is divided at the pitch p1 along the X-direction by the cylindrical lens group 8aa formed on the light source side of the first fly's eye member 8a, the divided beams are condensed by refracting faces of the cylindrical lens group, the condensed beams are then condensed by refracting faces of the corresponding cylindrical lenses in the cylindrical lens group 8ba formed on the light source side of the second fly's eye member 8b, and the condensed beams are converged on the rear focal plane of the cylindrical micro fly's eye lens 8.

When attention is focused on the refracting action in the Z-direction of the cylindrical micro fly's eye lens 8 (i.e., the refracting action in the YZ plane), the wavefront of a parallel beam incident along the optical axis AX is divided at the pitch p2 along the Z-direction by the cylindrical lens group 8ab formed on the mask side of the first fly's eye member 8a, the divided beams are condensed by refracting faces of the cylindrical lens group, the condensed beams are then condensed by refracting faces of the corresponding cylindrical lenses in the cylindrical lens group 8bb formed on the mask side of the second fly's eye member 8b, and the condensed beams are converged on the rear focal plane of the cylindrical micro fly's eye lens 8.

As described above, the cylindrical micro fly's eye lens 8 is composed of the first fly's eye member 8a and the second fly's eye member 8b in each of which the cylindrical lens groups are arranged on the two side faces thereof, and exercises the same optical function as a micro fly's eye lens in which a large number of micro refracting faces of a rectangular shape in the size of p1 in the X-direction and in the size of p2 in the Z-direction are integrally formed horizontally and vertically and densely. The cylindrical micro fly's eye lens 8 is able to achieve smaller change in distortion due to variation in surface shapes of the micro refracting faces and, for example, to keep less influence on the illuminance distribution from manufacture errors of the large number of micro refracting faces integrally formed by etching.

The position of the predetermined plane 5 is located near the front focal point of the zoom lens 7 and the entrance surface of the cylindrical micro fly's eye lens 8 is located near the rear focal point of the zoom lens 7. In other words, the zoom lens 7 sets the predetermined plane 5 and the entrance surface of the cylindrical micro fly's eye lens 8 substantially in the Fourier transform relation and, thus, keeps the pupil plane of the afocal lens 4 approximately optically conjugate with the entrance surface of the cylindrical micro fly's eye lens 8.

Therefore, for example, a quadrupolar illumination field consisting of two circular light intensity distributional areas spaced in the Z-direction with a center on the optical axis AX and two circular light intensity distributional areas spaced in the X-direction with a center on the optical axis AX is formed on the entrance surface of the cylindrical micro fly's eye lens 8 as on the pupil plane of the afocal lens 4. The overall shape of this quadrupolar illumination field similarly varies depending upon the focal length of the zoom lens 7. The rectangular micro refracting faces as wavefront division units in the cylindrical micro fly's eye lens 8 are of a rectangular shape similar to a shape of an illumination field to be formed on the mask M (and, therefore, similar to a shape of an exposure region to be formed on the wafer W).

The beam incident to the cylindrical micro fly's eye lens 8 is two-dimensionally divided to form a secondary light source with a light intensity distribution approximately identical with the illumination field formed by the incident beam, i.e., a secondary light source of a quadrupolar shape (quadrupolar illumination pupil luminance distribution) consisting of two circular substantial surface illuminants spaced in the Z-direction with a center on the optical axis AX and two circular substantial surface illuminants spaced in the X-direction with a center on the optical axis AX, on or near its rear focal plane (and thus on the illumination pupil). Beams from the secondary light source formed on or near the rear focal plane of the cylindrical micro fly's eye lens 8 are then incident to an aperture stop 9 located near it.

The aperture stop 9 has quadrupolar apertures (light transmitting portions) corresponding to the secondary light source of the quadrupolar shape fowled on or near the rear focal plane of the cylindrical micro fly's eye lens 8. The aperture stop 9 is configured so as to be detachable with respect to the illumination optical path and to be switchable with a plurality of aperture stops having apertures of different sizes and shapes. A method of switching the aperture stops can be, for example, a known turret method or slide method. The aperture stop 9 is arranged at a position approximately optically conjugate with an entrance pupil plane of projection optical system PL described later, and defines a range of the secondary light source that contributes to illumination.

The beams from the secondary light source limited by the aperture stop 9 travel through a condenser optical system 10 to superposedly illuminate a mask blind 11. In this way, an illumination field of a rectangular shape according to the shape and focal length of the rectangular micro refracting faces as wavefront division units of the cylindrical micro fly's eye lens 8 is formed on the mask blind 11 as an illumination field stop. Beams having passed through a rectangular aperture (light transmitting portion) of the mask blind 11 is condensed by an imaging optical system 12 to superposedly illuminate a mask M on which a predetermined pattern is formed. Namely, the imaging optical system 12 forms an image of the rectangular aperture of the mask blind 11 on the mask M.

A beam having passed through the mask M held on a mask stage MS travels through the projection optical system PL to form an image of the mask pattern on a wafer (photosensitive substrate) W held on a wafer stage WS. In this manner, the pattern of the mask M is sequentially transferred into each of exposure regions on the wafer W by performing one-shot exposure or scan exposure while two-dimensionally driving and controlling the wafer stage WS in the plane (XY plane) perpendicular to the optical axis AX of the projection optical system PL and, therefore, while two-dimensionally driving and controlling the wafer W.

The conical axicon system 6 is composed of the following members arranged in the order named from the light source side: first prism member 6a with a plane on the light source side and with a refracting surface of a concave conical shape on the mask side; and second prism member 6b with a plane on the mask side and with a refracting surface of a convex conical shape on the light source side. The concave conical refracting surface of the first prism member 6a and the convex conical refracting surface of the second prism member 6b are complementarily formed so as to be able to contact each other. At least one member out of the first prism member 6a and the second prism member 6b is configured to be movable along the optical axis AX, whereby the spacing is made variable between the concave conical refracting surface of the first prism member 6a and the convex conical refracting surface of the second prism member 6b. For easier understanding, the action of the conical axicon system 6 and the action of the zoom lens 7 will be described with focus on the secondary light source of the quadrupolar or annular shape.

In a state in which the concave conical refracting surface of the first prism member 6a and the convex conical refracting surface of the second prism member 6b contact each other, the conical axicon system 6 functions as a plane-parallel plate and causes no effect on the secondary light source of the quadrupolar or annular shape formed. However, as the concave conical refracting surface of the first prism member 6a and the convex conical refracting surface of the second prism member 6b are separated away from each other, the outside diameter (inside diameter) of the quadrupolar or annular secondary light source varies while keeping constant the width of the quadrupolar or annular secondary light source (half of a difference between a diameter (outside diameter) of a circle circumscribed to the quadrupolar secondary light source and a diameter (inside diameter) of a circle inscribed therein; half of a difference between the outside diameter and the inside diameter of the annular secondary light source). Namely, the annular ratio (inside diameter/outside diameter) and the size (outside diameter) of the quadrupolar or annular secondary light source vary.

The zoom lens 7 has a function to enlarge or reduce the overall shape of the quadrupolar or annular secondary light source similarly (or isotropically). For example, as the focal length of the zoom lens 7 is increased from a minimum value to a predetermined value, the overall shape of the quadrupolar or annular secondary light source is similarly enlarged. In other words, the width and size (outside diameter) of the secondary light source both vary, without change in the annular ratio of the quadrupolar or annular secondary light source, by the action of the zoom lens 7. In this manner, the annular ratio and size (outside diameter) of the quadrupolar or annular secondary light source can be controlled by the actions of the conical axicon system 6 and the zoom lens 7.

In the present embodiment, the spatial light modulators 33, 34 to be used can be, for example, those continuously changing each of orientations of the mirror elements 33a, 34a arranged two-dimensionally. Such spatial light modulators can be selected, for example, from the spatial light modulators disclosed in Japanese Patent Application Laid-open (Translation of PCT Application) No. 10-503300 and European Patent Application Publication EP 779530 corresponding thereto, Japanese Patent Application Laid-open No. 2004-78136 and U.S. Pat. No. 6,900,915 corresponding thereto, Japanese Patent Application Laid-open (Translation of PCT Application) No. 2006-524349 and U.S. Pat. No. 7,095,546 corresponding thereto, and Japanese Patent Application Laid-open No. 2006-113437. It is also possible to control the orientations of the mirror elements 33a, 34a arranged two-dimensionally, in a plurality of discrete steps. The teachings in European Patent Application Publication EP 779530, U.S. Pat. Nos. 6,900,915, and 7,095,546 are incorporated herein by reference.

Figure 4:
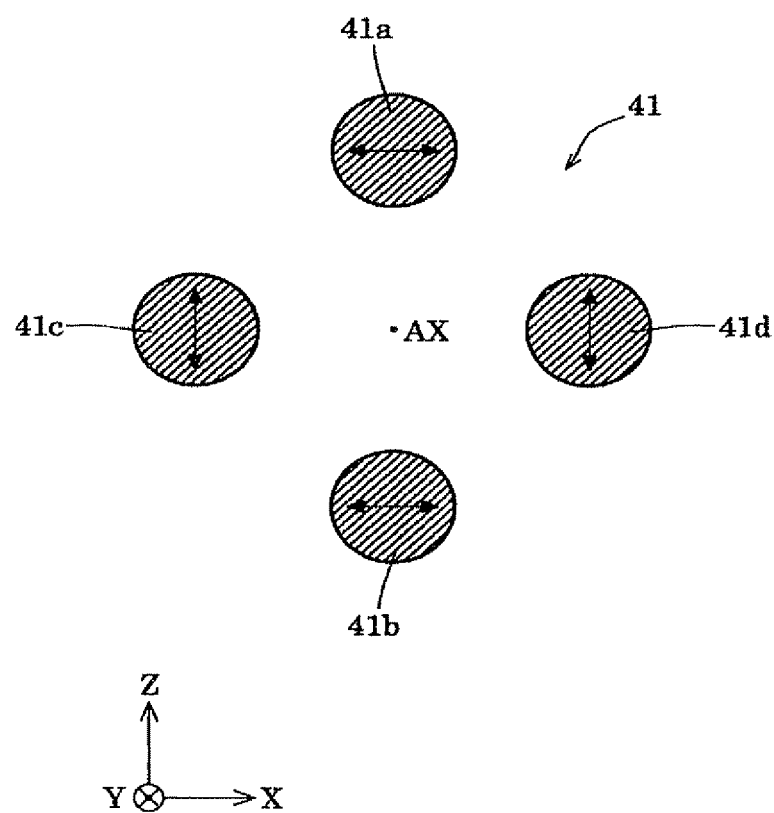
FIG. 4 is a drawing schematically showing a light intensity distribution of a quadrupolar shape formed on a pupil plane of an afocal lens in the embodiment.

In the first spatial light modulator 33, each of the postures of the mirror elements 33a varies by the action of the drive unit 33b operating according to a control signal from the control unit, whereby each mirror element 33a is set in a predetermined orientation. The s-polarized light reflected at respective predetermined angles by the mirror elements 33a of the first spatial light modulator 33 forms, for example, two circular light intensity distributional areas 41a and 41b spaced in the Z-direction with a center on the optical axis AX, on the pupil plane of the afocal lens 4, as shown in FIG. 4. The light forming the light intensity distributional areas 41a and 41b has the polarization direction along the X-direction as indicated by double-headed arrows in the drawing.

Similarly, in the second spatial light modulator 34, each of the postures of the mirror elements 34a varies by the action of the drive unit 34b operating according to a control signal from the control unit, whereby each mirror element 34a is set in a predetermined orientation. The p-polarized light reflected at respective predetermined angles by the mirror elements 34a of the second spatial light modulator 34 forms, for example, two circular light intensity distributional areas 41c and 41d spaced in the X-direction with a center on the optical axis AX, on the pupil plane of the afocal lens 4, as shown in FIG. 4. The light forming the light intensity distributional areas 41c and 41d has the polarization direction along the Z-direction as indicated by double-headed arrows in the drawing. When the polarization state of the beam incident into the spatial light modulation unit 3 is circular polarization or linear polarization with the polarization direction at an angle of 45° to the X-axis and Z-axis (which will be referred to hereinafter as "45° linear polarization"), the light intensities of the four light intensity distributional areas 41a-41d become equal to each other.

The light forming the quadrupolar light intensity distribution 41 on the pupil plane of the afocal lens 4 forms the light intensity distribution of the quadrupolar shape corresponding to the light intensity distributional areas 41a-41d on the entrance surface of the cylindrical micro fly's eye lens 8, and on the rear focal plane of the cylindrical micro fly's eye lens 8 or on the illumination pupil near it (the position where the aperture stop 9 is arranged). Namely, the afocal lens 4, zoom lens 7, and cylindrical micro fly's eye lens 8 constitute a distribution forming optical system which forms a predetermined light intensity distribution on the illumination pupil of the illumination optical apparatus (2-12), based on the beams having traveled via the first spatial light modulator 33 and the second spatial light modulator 34. Furthermore, the light intensity distribution of the quadrupolar shape corresponding to the light intensity distributional areas 41a-41d is also formed at other illumination pupil positions optically conjugate with the aperture stop 9, i.e., at the pupil position of the imaging optical system 12 and at the pupil position of the projection optical system PL.

The exposure apparatus performs exposure under an appropriate illumination condition according to a pattern characteristic, in order to highly accurately and faithfully transfer the pattern of the mask M onto the wafer W. In the present embodiment, the illumination pupil luminance distribution to be formed is the quadrupolar illumination pupil luminance distribution corresponding to the quadrupolar light intensity distribution 41 shown in FIG. 4 and the beams passing through this quadrupolar illumination pupil luminance distribution are set in a circumferential polarization state. In the circumferential polarization quadrupolar illumination based on the quadrupolar illumination pupil luminance distribution in the circumferential polarization state, the light impinging upon the wafer W as a final illumination target surface is in a polarization state in which the principal component is s-polarized light.

Here the s-polarized light is linearly polarized light with the polarization direction along a direction normal to a plane of incidence (which is polarized light with the electric vector vibrating in the direction normal to the plane of incidence). The plane of incidence is defined as a plane that includes a point where light impinges upon a boundary surface of a medium (illumination target surface: surface of wafer W) and that includes a normal to the boundary surface at that point and a direction of incidence of the light. As a consequence, the circumferential polarization quadrupolar illumination achieves an improvement in optical performance of the projection optical system (the depth of focus and others), whereby a good mask pattern image is obtained with high contrast on the wafer (photosensitive substrate).

Since the present embodiment uses the spatial light modulation unit 3 with the pair of spatial light modulators 33, 34 in which the postures of the mirror elements 33a, 34a each are individually changed, it is feasible to freely and quickly change the illumination pupil luminance distribution consisting of the first light intensity distribution in the s-polarized state formed on the illumination pupil by the action of the first spatial light modulator 33 and the second light intensity distribution in the p-polarized state formed on the illumination pupil by the action of the second spatial light modulator 34. In other words, the present embodiment is able to realize the illumination conditions of great variety in terms of the shape, size, and polarization state of the illumination pupil luminance distribution, by changing each of the shapes and sizes of the first light intensity distribution and the second light intensity distribution in mutually different polarization states.

As described above, the illumination optical apparatus (2-12) to illuminate the mask M as an illumination target surface on the basis of the light from the light source 1 in the present embodiment is able to realize the illumination conditions of great variety in terms of the shape, size, and polarization state of the illumination pupil luminance distribution. Furthermore, the exposure apparatus (1-WS) of the present embodiment is able to perform good exposure under an appropriate illumination condition realized according to the pattern characteristic of the mask M, using the illumination optical apparatus (2-12) capable of realizing the illumination conditions of great variety.

In the present embodiment, when the spatial light modulators 33 and 34 are in the standard state, the traveling direction of the incident beam to the polarization separating film 35 functioning as a light splitter is parallel to (or coincident with) the traveling direction of the exiting beam from the polarization separating film 36 functioning as a light combiner. In other words, in the standard state of the spatial light modulators 33 and 34, the traveling directions of the incident beam to the spatial light modulation unit 3 and the exiting beam from the spatial light modulation unit 3 are coincident with (or parallel to) the optical axis AX of the illumination optical apparatus. Since the optical paths upstream and downstream of the spatial light modulation unit 3 are coaxial (or parallel), the optical system can be shared, for example, with the conventional illumination optical apparatus using a diffractive optical element for formation of the illumination pupil luminance distribution.

In the present embodiment, the mirror elements 33a of the first spatial light modulator 33 are arranged near the prism member 31 and the mirror elements 34a of the second spatial light modulator 34 are arranged near the prism member 32. In this case, the prism members 31, 32 serve as cover members for the mirror elements 33a, 34a, which can enhance the durability of the spatial light modulators 33, 34.

In the present embodiment, the spatial light modulation unit 3 may be so designed that the angle θ of incidence of the light (cf. FIG. 2) to the polarization separating film 35 formed between the prism members 31 and 32 is close to the Brewster's angle. This configuration can reduce the reflectance of p-polarized light on the polarization separating film 35 and increase polarization efficiency. The polarization separating films 35, 36 are not limited to those made of dielectric multilayer films, but may be, for example, those having "a polarization separating layer of a periodic grating structure." The "polarization separating layer of the periodic grating structure" of this type can be a wire grid type polarization separating element in which a plurality of metal gratings parallel to a first direction are periodically arranged in a second direction orthogonal to the first direction. This technology is disclosed, for example, in Japanese Patent Application Laid-open No. 2005-77819 and U.S. Pat. No. 7,116,478 corresponding thereto. The teachings in U.S. Pat. No. 7,116,478 are incorporated herein by reference.

In the above-described embodiment, the spatial light modulation unit 3 is composed of the pair of prism members 31 and 32 and the pair of spatial light modulators 33 and 34. However, without having to be limited to this, various forms can be contemplated for specific configurations of the spatial light modulation unit 3.

In the foregoing embodiment, the afocal lens 4, conical axicon system 6, and zoom lens 7 are arranged in the optical path between the spatial light modulation unit 3 and the cylindrical micro fly's eye lens 8. However, without having to be limited to this, these optical members can be replaced, for example, by a condensing optical system functioning as a Fourier transform lens.

In the foregoing embodiment, the p-polarized light having traveled via the polarization separating film 35 functioning as a light splitter is folded toward the second spatial light modulator 34 by total reflection on the interface 32a between the prism member 32 and the gas 37 as a first folding surface. Likewise, the p-polarized light having traveled via the second spatial light modulator 34 is folded toward the polarization separating film 36 functioning as a light combiner, by total reflection on the interface 32b between the prism member 32 and the gas 37. However, without having to be limited to this, it is also possible to provide a reflecting film on the interfaces 32a, 32b.

In the above description, the quadrupolar illumination pupil luminance distribution is formed by forming the Z-directionally dipolar light intensity distributional areas 41a, 41b by the action of the first spatial light modulator 33 and forming the X-directionally dipolar light intensity distributional areas 41c, 41d by the action of the second spatial light modulator 34. However, in the present embodiment, as described above, various forms can be contemplated as to the shape, size, and polarization state of the illumination pupil luminance distribution. The following will schematically describe an example of forming a pentapolar illumination pupil luminance distribution, with reference to FIG. 5.

In this example, as shown in the left view in FIG. 5, for example, two circular light intensity distributional areas 42a and 42b spaced in the Z-direction with a center on the optical axis AX and a circular light intensity distributional area 42c' with a center on the optical axis AX are formed on the pupil plane of the afocal lens 4 by the action of the first spatial light modulator 33. The light forming the light intensity distributional areas 42a, 42b, 42c' has the polarization direction along the X-direction as indicated by double-headed arrows in the drawing. On the other hand, as shown in the center view in FIG. 5, for example, two circular light intensity distributional areas 42d and 42e spaced in the X-direction with a center on the optical axis AX and a circular light intensity distributional area 42c" with a center on the optical axis AX are formed on the pupil plane of the afocal lens 4 by the action of the second spatial light modulator 34. The light forming the light intensity distributional areas 42d, 42e, 42c" has the polarization direction along the Z-direction as indicated by double-headed arrows in the drawing.

As a result, the light intensity distributional areas 42a-42e of the pentapolar shape are formed, as shown in the right view in FIG. 5, on the pupil plane of the afocal lens 4. The circular light intensity distributional area 42c with a center on the optical axis AX is formed by superposition of the light intensity distributional areas 42c' and 42c". When an optical path length difference of not less than a temporal coherence length of the light source 1 is provided between the s-polarized light traveling via the first spatial light modulator 33 to the pupil plane of the afocal lens 4 and the p-polarized light traveling via the second spatial light modulator 34 to the pupil plane of the afocal lens 4, the beam with the polarization direction along the Z-direction and the beam with the polarization direction along the X-direction as indicated by the double-headed arrows in the drawing pass through the region of the light intensity distributional area 42c.

In contrast to it, when there is no path length difference between the s-polarized light traveling via the first spatial light modulator 33 to the pupil plane of the afocal lens 4 and the p-polarized light traveling via the second spatial light modulator 34 to the pupil plane of the afocal lens 4, the polarization state of the beam passing through the region of the light intensity distributional area 42c coincides with the polarization state of the incident beam to the spatial light modulation unit 3. When the polarization state of the beam incident to the spatial light modulation unit 3 is circular polarization or 45° linear polarization, the light intensities of the four surrounding light intensity distributional areas 42a, 42b, 42d, 42e are equal to each other and the light intensity of the center light intensity distributional area 42c is twice the light intensities of the other areas.

As another example, light having passed through a half wave plate may be made incident to the polarization separating film 35 functioning as a light splitter. A ratio of intensities of the s-polarized light and the p-polarized light separated by the polarization separating film 35 can be controlled by rotating the half wave plate arranged on the light source side with respect to the polarization separating film 35, around the optical axis. Namely, it is feasible to control the ratio of intensities of s-polarized light and p-polarized light reaching the pupil plane of the afocal lens 4. It is also possible to make only the s-polarized light or p-polarized light reach the pupil plane of the afocal lens 4, for example, by controlling the angle of rotation of the half wave plate so as to make the s-polarized light incident to the polarization separating film 35 or by controlling the angle of rotation of the half wave plate so as to make the p-polarized light incident to the polarization separating film 35. This permits a dipolar light intensity distribution (e.g., light intensity distributional areas 41a, 41b in FIG. 4) to be formed on the pupil plane of the afocal lens 4.

Figure 6:
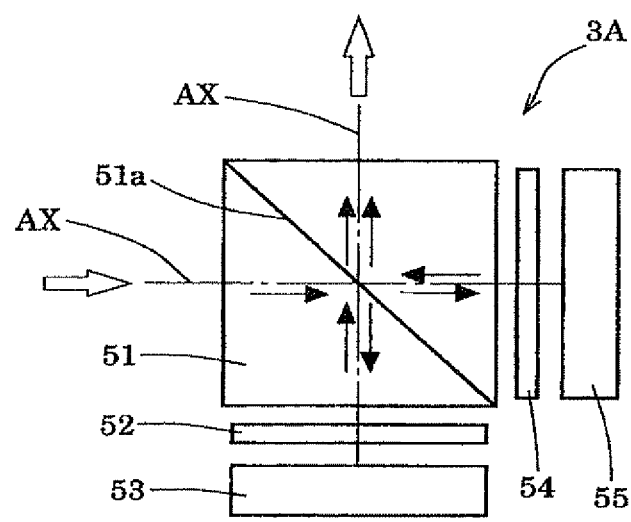
FIG. 6 is a drawing schematically showing a configuration of a spatial light modulation unit according to a modification example in which a light splitter and a light combiner include a common polarization beam splitter.

In the foregoing embodiment, the polarization separating film 35 located on the light splitting surface functions as a light splitter and the polarization separating film 36 located on the light combining surface at the position different from that of the polarization separating film 35 functions as a light combiner. However, without having to be limited to this, it is also possible to adopt a modification example in which the light splitter and the light combiner have a common polarization beam splitter 51, for example, as shown in FIG. 6. In the spatial light modulation unit 3A shown in the modification example of FIG. 6, the s-polarized light reflected on a polarization separating film 51a, in the light incident along the optical axis AX into the polarization beam splitter 51, travels through a quarter wave plate 52 to become circularly polarized light, and the circularly polarized light is incident to the first spatial light modulator 53.

Light reflected by a plurality of mirror elements of the first spatial light modulator 53 travels through the quarter wave plate 52 to become p-polarized light and the p-polarized light returns to the polarization beam splitter 51. The p-polarized light having traveled via the first spatial light modulator 53 to enter the polarization beam splitter 51, passes through the polarization separating film 51a to be emitted from the polarization beam splitter 51. In the standard state of the first spatial light modulator 53, the light having traveled along the optical axis AX into the spatial light modulation unit 3A and then via the first spatial light modulator 53 is emitted along the optical axis AX from the spatial light modulation unit 3A.

On the other hand, the p-polarized light passing through the polarization separating film 51a of the polarization beam splitter 51 travels through a quarter wave plate 54 to become circularly polarized light, and the circularly polarized light is incident to the second spatial light modulator 55. Light reflected by a plurality of mirror elements of the second spatial light modulator 55 travels through the quarter wave plate 54 to become s-polarized light and the s-polarized light returns to the polarization beam splitter 51. The s-polarized light having traveled via the second spatial light modulator 55 and having entered the polarization beam splitter 51, is reflected by the polarization separating film 51a and the reflected light is emitted from the polarization beam splitter 51. In the standard state of the second spatial light modulator 55, the light having traveled along the optical axis AX into the spatial light modulation unit 3A and then via the second spatial light modulator 55, is emitted along the optical axis AX from the spatial light modulation unit 3A.

In the above description, the spatial light modulators with the plurality of optical elements arranged two-dimensionally and controlled individually are those in which the orientations of the reflecting surfaces (angles: inclinations) arranged two-dimensionally can be individually controlled. However, without having to be limited to this, it is also possible, for example, to use spatial light modulators in which heights (positions) of the reflecting surfaces arranged two-dimensionally can be individually controlled. The spatial light modulators of this type applicable herein can be selected, for example, from the spatial light modulators disclosed in Japanese Patent Application Laid-open No. 6-281869 and U.S. Pat. No. 5,312,513 corresponding thereto, and in FIG. 1d in Japanese Patent Application Laid-open (Translation of PCT Application) No. 2004-520618 and U.S. Pat. No. 6,885,493 corresponding thereto. These spatial light modulators are able to apply the same action as a diffracting surface, to the incident light by forming a two-dimensional height distribution. The above-described spatial light modulators with the plurality of reflecting surfaces arranged two-dimensionally may be modified, for example, according to the disclosure in Japanese Patent Application Laid-open (Translation of PCT Application) No. 2006-513442 and U.S. Pat. No. 6,891,655 corresponding thereto, or according to the disclosure in Japanese Patent Application Laid-open (Translation of PCT Application) No. 2005-524112 and U.S. Pat. Published Application No. 2005/0095749 corresponding thereto. The teachings in U.S. Pat. Nos. 5,312,513, 6,885,493, 6,891,655, and U.S. Pat. Published Application No. 2005/0095749 are incorporated herein by reference.

Figure 7:
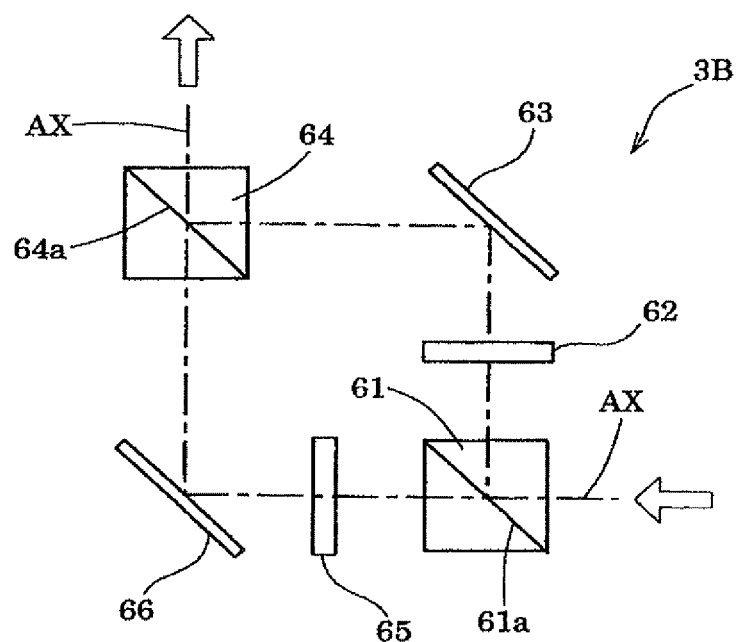
FIG. 7 is a drawing schematically showing a configuration of a spatial light modulation unit according to another modification example having transmissive spatial light modulators.

In the above description, the spatial light modulators used are the reflective spatial light modulators with the plurality of mirror elements, but, without having to be limited to this, it is also possible, for example, to use the transmissive spatial light modulator disclosed in U.S. Pat. No. 5,229,872. The teachings in U.S. Pat. No. 5,229,872 are incorporated herein by reference. FIG. 7 schematically shows a configuration of a spatial light modulation unit according to a modification example having transmissive spatial light modulators. In the spatial light modulation unit 3B shown in the modification example of FIG. 7, the s-polarized light reflected by a polarization separating film 61a, in light incident along the optical axis AX to a polarization beam splitter 61 functioning as a light splitter, is incident into a first spatial light modulator 62.

The light having passed through a plurality of optical elements (prism elements or the like) of the first spatial light modulator 62 is folded by a path folding mirror 63 and thereafter the folded light is incident to a polarization beam splitter 64 functioning as a light combiner. The s-polarized light having traveled via the first spatial light modulator 62 and having entered the polarization beam splitter 64 is reflected by a polarization separating film 64a and the reflected light is emitted from the polarization beam splitter 64. In the standard state of the first spatial light modulator 62, the light having traveled along the optical axis AX into the spatial light modulation unit 3B and then through the first spatial light modulator 62 is emitted along the optical axis AX from the spatial light modulation unit 3B.

The p-polarized light having passed through the polarization separating film 61a of the polarization beam splitter 61 is incident into a second spatial light modulator 65. The light having passed through a plurality of optical elements of the second spatial light modulator 65 is folded by a path folding mirror 66 and the folded light is incident to the polarization beam splitter 64. The p-polarized light having traveled via the second spatial light modulator 65 and having entered the polarization beam splitter 64, travels through the polarization separating film 64a and is emitted from the polarization beam splitter 64. In the standard state of the second spatial light modulator 65, the light having traveled along the optical axis AX into the spatial light modulation unit 3B and then through the second spatial light modulator 65 is emitted along the optical axis AX from the spatial light modulation unit 3B.

Figure 8:
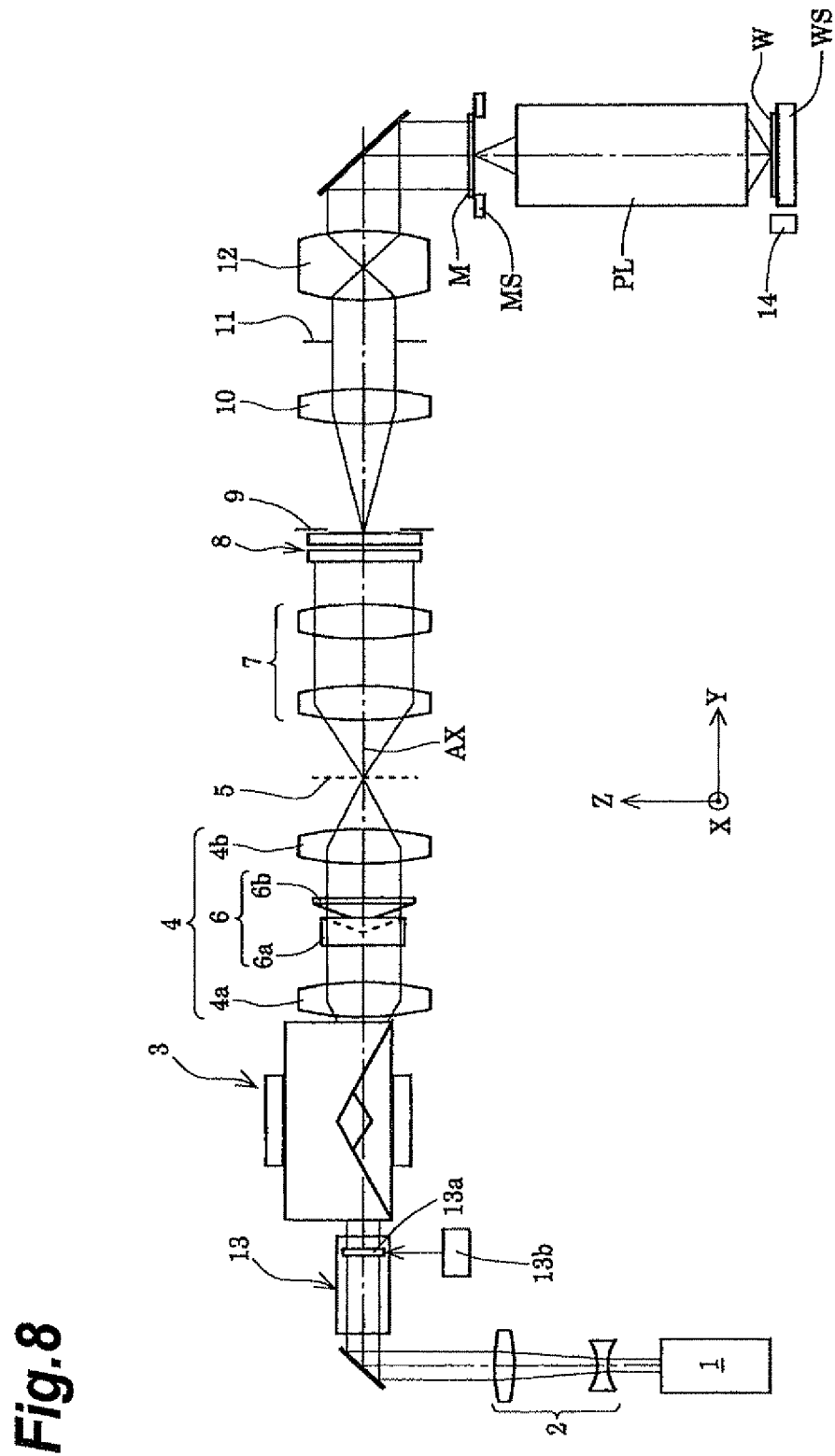
FIG. 8 is a drawing schematically showing a configuration of an exposure apparatus according to a modification example having a polarization control unit.

In the above description, the optical system is so configured that the light from the light source 1 supplying the light in the polarization state in which linearly polarized light is a principal component, is guided to the spatial light modulation unit (3; 3A; 3B) while substantially maintaining the polarization state of the light, but it is also possible, for example, to adopt a modification example in which a polarization control unit 13 for making the polarization state of exiting light variable is provided in the optical path on the light source 1 side of the spatial light modulation unit 3, as shown in FIG. 8. In FIG. 8 the members with the same functionality as in FIG. 1 are denoted by the same reference symbols.

The polarization control unit 13 shown in the modification example of FIG. 8 receives the light from the light source 1 having traveled via the shaping optical system 2 and path folding mirror, and emits light in a desired polarization state toward the spatial light modulation unit 3. This polarization control unit 13 is composed, for example, of a half wave plate 13a arranged as rotatable around the optical axis or around an axis parallel to the optical axis, and a rotational drive unit 13b which rotationally drives the half wave plate 13a.

For example, linearly polarized light with the polarization direction (direction of the electric field) along the 45' direction to the X-axis or the Z-axis in the XZ plane can be supplied to the spatial light modulation unit 3, by rotationally adjusting the half wave plate 13a through the rotational drive unit 13b. At this time, the light quantity of the s-polarized light (the light traveling toward the first spatial light modulator 33) and the light quantity of the p-polarized light (the light traveling toward the second spatial light modulator 34) separated by the polarization separating film of the spatial light modulation unit 3 become approximately equal.

By the rotational adjustment of the half wave plate 13a in the polarization control unit 13, it is feasible to set the ratio of the light quantities of the s-polarized light (the light toward the first spatial light modulator 33) and the p-polarized light (the light toward the second spatial light modulator 34) separated by the polarization separating film of the spatial light modulation unit 3, to any light quantity ratio. For example, in the case where the quadrupolar light intensity distributional areas 41a-41d as shown in FIG. 4 are formed, a ratio of the light intensity of the two light intensity distributional areas 41a, 41b spaced in the Z-direction with a center on the optical axis AX and the light intensity of the two light intensity distributional areas 41c, 41d spaced in the X-direction with a center on the optical axis AX can be set at a desired light quantity ratio.

In the modification example shown in FIG. 8, the apparatus may be so arranged that an illumination pupil polarization distribution is measured by a pupil polarization distribution measuring device 14 and that the polarization control unit 13 is controlled according to the result of the measurement. In this case, each spatial light modulator in the spatial light modulation unit may be controlled as occasion may demand. This pupil polarization distribution measuring device 14 is a device that is provided in the wafer stage WS for holding the wafer W or in a measurement stage provided separately from the wafer stage WS, and that measures the polarization state in the pupil (or in the aperture) of the illumination light (exposure light) incident to the wafer W. The detailed configuration and action of the polarization state measuring device 14 are disclosed, for example, in Japanese Patent Application Laid-open No. 2005-5521. The teachings in Japanese Patent Application Laid-open No. 2005-5521 are incorporated herein by reference.

This configuration is effective as follows: for example, even when there is a reflectance difference between polarizations in each path folding mirror arranged in the illumination optical system or in the projection optical system, adverse effect thereby can be prevented. In the modification example of FIG. 8 the direction of polarization to the spatial light modulation unit 3 is adjusted by the polarization control unit 13, but the same effect can also be achieved by rotating the light source 1 itself or the spatial light modulation unit 3 around the optical axis. This polarization control unit 13 can also be applied to the modification examples shown in FIGS. 6 and 7.

In the aforementioned embodiment and the modification examples of FIGS. 6 to 8, the light splitter and the light combiner have the polarization separating film (35, 36; 51*a*; 61*a*, 64*a*), but, without having to be limited to this, it is also possible to adopt a configuration in which the light splitter and the light combiner have a separating film to effect amplitude division of a beam. In this case, the first light intensity distribution formed on the illumination pupil by the action of the first spatial light modulator has the same polarization state as the second light intensity distribution formed on the illumination pupil by the action of the second spatial light modulator, but it becomes feasible to realize illumination conditions of great variety in terms of the shape and size of the illumination pupil luminance distribution, by changing each of the shapes and sizes of the first light intensity distribution and the second light intensity distribution.

Figure 9:
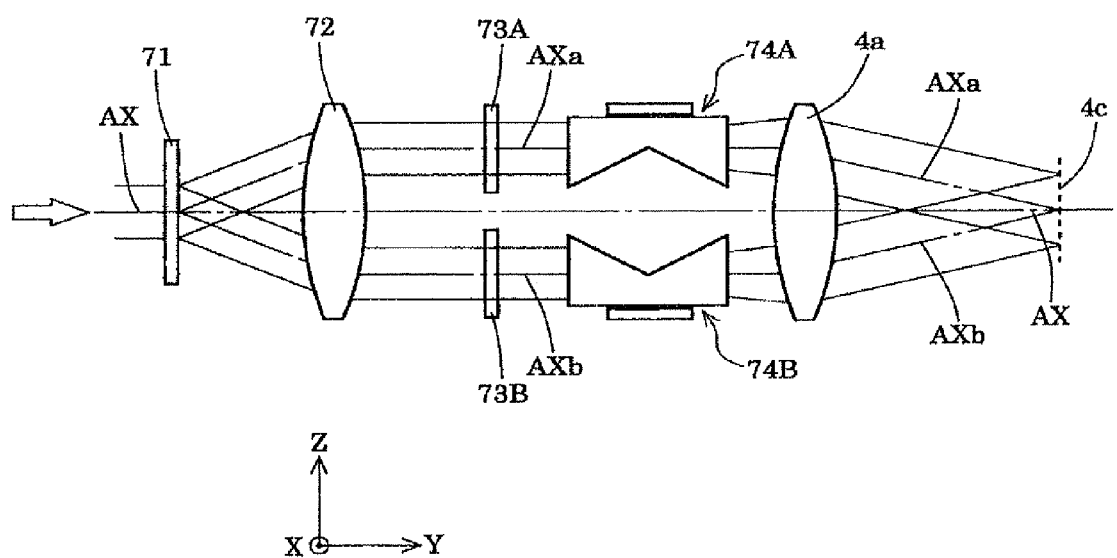
FIG. 9 is a drawing schematically showing a major configuration of a modification example using a diffractive optical element as a light splitter.

In the aforementioned embodiment and the modification examples of FIGS. 6 to 8, the polarization separating film (35; 51*a*; 61*a*) is used to split the incident beam into two beams, but, without having to be limited to this, it is also possible, for example, to adopt a configuration in which a diffractive optical element is used to split the incident beam into two beams. FIG. 9 is a drawing schematically showing a major configuration of a modification example using a diffractive optical element as a light splitter. The modification example of FIG. 9 has a configuration in which the spatial light modulation unit 3 in the embodiment of FIG. 1 is replaced by a diffractive optical element 71, a condenser lens 72, a pair of half wave plates 73A, 73B, and a pair of spatial light modulation units 74A, 7413.

In the modification example of FIG. 9, the beam from the light source 1 having traveled through the shaping optical system 2 is incident along the optical axis AX to the diffractive optical element 71 as a light splitter. The diffractive optical element 71 has such a function that, for example, when a parallel beam with a rectangular cross section is incident along the optical axis AX thereto, it forms two rectangular light intensity distributional areas spaced in the Z-direction with a center on the optical axis AX, in its far field (or Fraunhofer diffraction region). In other words, the diffractive optical element 71 functions to split the incident light into two beams.

The first beam out of the two beams split by the diffractive optical element 71 travels through the condenser lens 72 functioning as a Fourier transform lens and then enters the half wave plate 73A rotatable around the optical axis AXa of the optical path of the first beam or around an axis parallel to the optical axis AXa. Light in a linearly polarized state having passed through the half wave plate 73A travels via the spatial light modulation unit 74A and thereafter travels through the front lens unit 4*a* of the afocal lens 4 to reach the pupil plane 4*c* of the afocal lens 4. On the other hand, the second beam out of the two beams split by the diffractive optical element 71 travels through the condenser lens 72 and enters the half wave plate 73B rotatable around the optical axis AXb of the optical path of the second beam or around an axis parallel to the optical axis AXb. Light in a linearly polarized state having passed through the half wave plate 7313 travels via the spatial light modulation unit 74B and thereafter travels through the front lens unit 4*a* of the afocal lens 4 to reach the pupil plane 4*c*. The front lens unit 4*a* of the afocal lens 4 is an optical system which superimposes the beam having passed via the spatial light modulator in the spatial light modulation unit 74A and the beam having passed via the spatial light modulator in the spatial light modulation unit 74B, on the pupil plane 4*c*, and functions as a light combiner.

For brevity of description, it is assumed hereinafter that the spatial light modulation unit 74A arranged in the optical path of the first beam and the spatial light modulation unit 7413 arranged in the optical path of the second beam have the same configuration. It is also assumed that a parallel beam in a linearly polarized state with the polarization direction along a direction at 45° to the Z-direction and the X-direction is incident to the diffractive optical element 71, that light in an X-directionally linearly polarized state (laterally polarized state) with polarization along the X-direction is incident to the spatial light modulation unit 74A because of the action of the half wave plate 73A, and that light in a Z-directionally linearly polarized state (vertically polarized state) with polarization along the Z-direction is incident to the spatial light modulation unit 74B because of the action of the half wave plate 738.

Figure 10:
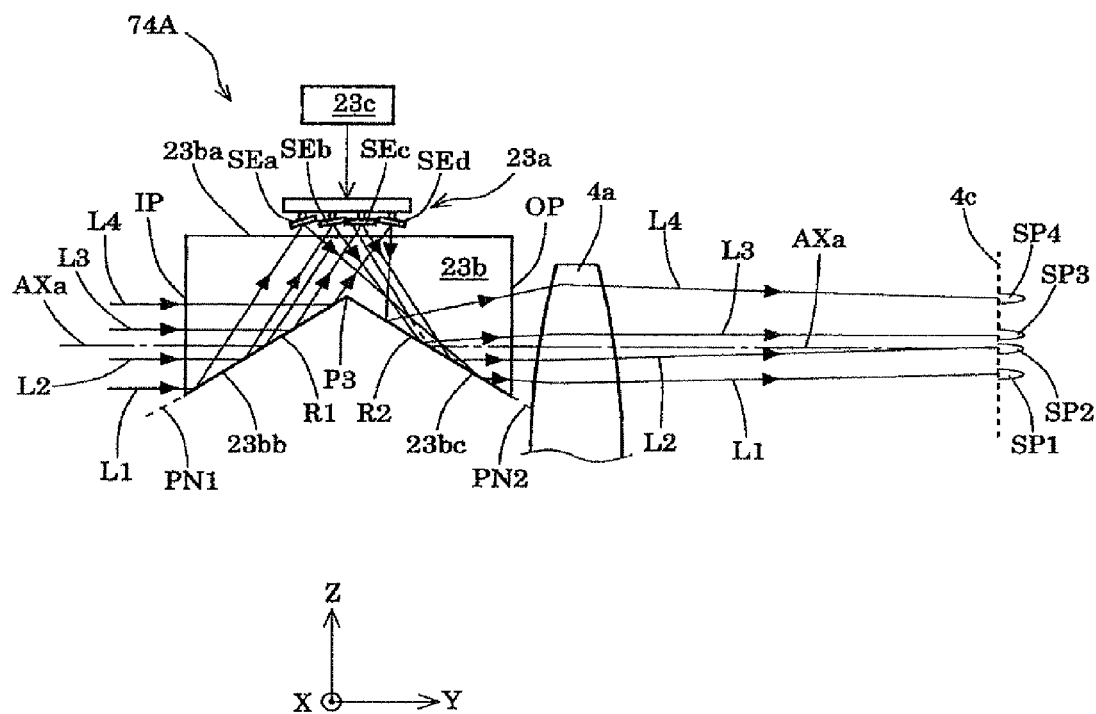
FIG. 10 is a drawing schematically showing a configuration of the spatial light modulation unit shown in FIG. 9.
Figure 11:
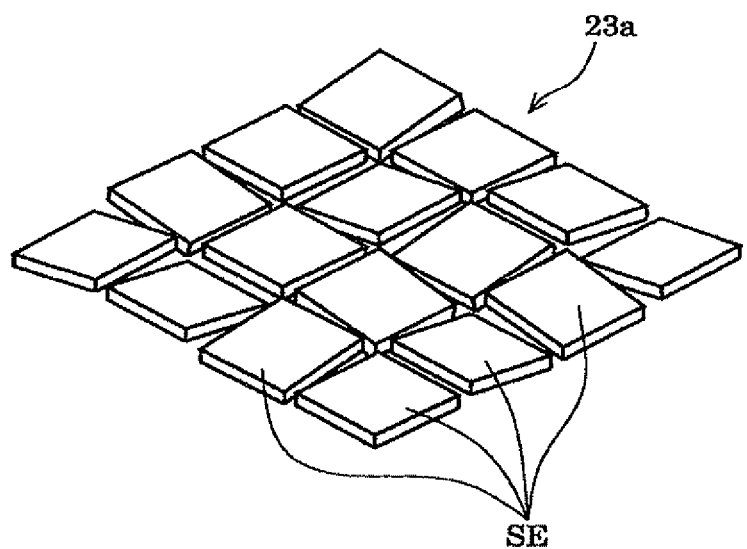
FIG. 11 a partial perspective view of a spatial light modulator in the spatial light modulation unit shown in FIG. 9.

The specific configuration and action of the spatial light modulation unit 74A will be described below with reference to FIGS. 10 and 11. Since the spatial light modulation unit 74B basically has the same configuration as the spatial light modulation unit 74A, redundant description is omitted about the specific configuration and action of the spatial light modulation unit 74B. The spatial light modulation unit 74A, as shown in FIG. 10, has a prism 23*b* made of an optical material, e.g., fluorite, and a reflective spatial light modulator 23*a* attached in proximity to a side face 23*ba* of the prism 23*b* parallel to the XY plane. The optical material for making the prism 23*b* does not have to be limited to fluorite, but may be silica or any other optical material according to the wavelength of the light supplied from the light source 1.

The prism 23*b* has a form obtained by replacing one side face of a rectangular parallelepiped (a side face opposed to the side face 23*ba* to which the spatial light modulator 23*a* is attached in proximity) by side faces 23*bb* and 23*bc* depressed in a V-shape, and is also called a K prism because of the sectional shape along the YZ plane. The side faces 23*bb* and 23*bc* depressed in the V-shape in the prism 23*b* are defined by two planes PN1 and PN2 intersecting at an obtuse angle. The two planes PN1 and PN2 both are orthogonal to the YZ plane and make the V-shape along the YZ plane.

Internal surfaces of the two side faces 23*bb* and 23*bc* in contact along an intersecting line (straight line extending in the X-direction) P3 between the two planes PN1 and PN2 function as reflecting surfaces R1 and R2. Namely, the reflecting surface R1 is located on the plane PN1, the reflecting surface R2 is located on the plane PN2, and an angle between the reflecting surfaces R1 and R2 is an obtuse angle. As an example, the angles can be determined as follows: the angle between the reflecting surfaces R1 and R2 is 120°; the angle between the entrance surface IP of the prism 23b perpendicular to the optical axis AXa, and the reflecting surface R1 is 60°; the angle between the exit surface OP of the prism 23b perpendicular to the optical axis AXa, and the reflecting surface R2 is 60°.

In the prism 23b, the side face 23ba to which the spatial light modulator 23a is attached in proximity is parallel to the optical axis AXa; and the reflecting surface R1 is located on the light source 1 side (on the upstream side of the exposure apparatus; on the left in FIG. 10) and the reflecting surface R2 is located on the afocal lens 4 side (on the downstream side of the exposure apparatus; on the right in FIG. 10). More specifically, the reflecting surface R1 is obliquely arranged with respect to the optical axis AXa and the reflecting surface R2 is obliquely arranged with respect to the optical axis AXa and in symmetry with the reflecting surface R1 with respect to a plane passing the intersecting line P3 and being parallel to the XZ plane. The side face 23ba of the prism 23b is an optical surface opposed to a surface on which the plurality of mirror elements SE of the spatial light modulator 23a are arranged, as described below.

The reflecting surface R1 of the prism 23b reflects the light incident through the entrance surface IP, toward the spatial light modulator 23a. The spatial light modulator 23a is located in the optical path between the reflecting surface R1 and the reflecting surface R2 and reflects the light incident via the reflecting surface R1. The reflecting surface R2 of the prism 23b reflects the light incident via the spatial light modulator 23a to guide the reflected light through the exit surface OP to the front lens unit 4a of the afocal lens 4. In FIG. 10, the optical paths are expanded so that the optical axis AXa extends linearly on the rear side of the spatial light modulation unit 74A, for easier understanding of description. FIG. 10 shows the example wherein the prism 23b is integrally made of one optical block, but the prism 23b may be constructed using a plurality of optical blocks.

The spatial light modulator 23a applies spatial modulation according to a position of incidence of light, to the light incident via the reflecting surface R1. The spatial light modulator 23a is provided with a plurality of micro mirror elements (optical elements) SE arranged two-dimensionally, as shown in FIG. 11. For easier description and illustration, FIGS. 10 and 11 show a configuration example in which the spatial light modulator 23a has sixteen mirror elements SE of a 4×4 matrix, but the spatial light modulator actually has a much larger number of mirror elements than sixteen elements.

With reference to FIG. 10, among a bundle of rays incident along a direction parallel to the optical axis AXa into the spatial light modulation unit 23, a ray L1 is incident to a mirror element SEa out of the plurality of mirror elements SE, and a ray L2 is incident to a mirror element SEb different from the mirror element SEa. Similarly, a ray L3 is incident to a mirror element SEc different from the mirror elements SEa, SEb and a ray L4 is incident to a mirror element SEd different from the mirror elements SEa-SEc. The mirror elements SEa-SEd apply respective spatial modulations set according to their positions, to the rays L1-L4, respectively.

The spatial light modulation unit 23 is so configured that in the standard state in which the reflecting surfaces of all the mirror elements SE of the spatial light modulator 23a are set in parallel with the XY plane, the rays incident along a direction parallel to the optical axis AXa to the reflecting surface R1 travel via the spatial light modulator 23a and thereafter are reflected to a direction parallel to the optical axis AXa by the reflecting surface R2. Furthermore, the spatial light modulation unit 23 is so configured that an air-equivalent length from the entrance surface LP of the prism 23b via the mirror elements SEa-SEd to the exit surface OP is equal to an air-equivalent length from the position corresponding to the entrance surface IP to the position corresponding to the exit surface OP without the prism 23b in the optical path. An air-equivalent length herein is obtained by converting an optical path length in an optical system into an optical path length in air having the refractive index of 1, and an air-equivalent length in a medium having the refactive index n is obtained by multiplying an optical path length therein by 1/n.

The surface in which the plurality of mirror elements SE of the spatial light modulator 23a are arrayed is positioned at or near the rear focal point of the condenser lens 72 and positioned at or near the front focal point of the afocal lens 4. Therefore, a beam having a cross section of a shape according to the characteristic of the diffractive optical element 71 (e.g., a rectangular shape) is incident to the spatial light modulator 23a. The light reflected by the mirror elements SEa-SEd of the spatial light modulator 23a and provided with a predetermined angle distribution forms predetermined light intensity distributional areas SP1-SP4 on the pupil plane 4c of the afocal lens 4. Namely, the front lens unit 4a of the afocal lens 4 converts angles given to the exiting light by the mirror elements SEa-SEd of the spatial light modulator 23a, into positions on the plane 4c being a far field region (Fraunhofer diffraction region) of the spatial light modulator 23a.

With reference to FIG. 1, the entrance surface of the cylindrical micro fly's eye lens 8 is positioned at or near a position optically conjugate with the pupil plane 4c (not shown in FIG. 1) of the afocal lens 4. Therefore, the light intensity distribution (luminance distribution) of the secondary light source formed by the cylindrical micro fly's eye lens 8 is a distribution according to the light intensity distributional areas SP1-SP4 formed on the pupil plane 4c by the spatial light modulator 23a and the front lens unit 4a of the afocal lens 4. The spatial light modulator 23a is a movable multi-mirror including the mirror elements SE being a large number of micro reflecting elements arranged regularly and two-dimensionally along one plane with a reflecting surface of a planar shape up, as shown in FIG. 11.

Each mirror element SE is movable and an inclination of the reflecting surface thereof, i.e., an angle and direction of inclination of the reflecting surface, is independently controlled by the action of the drive unit 23c (not shown in FIG. 11) operating according to commands from the control unit (not shown). Each mirror element SE can be continuously or discretely rotated by a desired angle of rotation around each of axes of rotation along two directions (X-direction and Y-direction) orthogonal to each other and parallel to the reflecting surface. Namely, inclinations of the reflecting surfaces of the respective mirror elements SE can be controlled two-dimensionally.

In a case where the reflecting surface of each mirror element SE is discretely rotated, a preferred switch control is such that the angle of rotation is switched in multiple stages (e.g., ..., −2.5°, −2.0°, ..., 0°, +0.5°, ..., +2.5°, ...). FIG. 11 shows the mirror elements SE with the contour of the square shape, but the contour of the mirror elements SE is not limited to the square. However, the contour may be a shape permitting arrangement of the mirror elements SE with a gap as small as possible (a shape permitting closest packing), from the viewpoint of efficiency of utilization of light. Furthermore, the spacing between two adjacent mirror elements SE may be minimum necessary, from the viewpoint of the light utilization efficiency.

In the spatial light modulator 23a, the postures of the respective mirror elements SE are changed by the action of the drive unit 23c operating according to control signals from the control unit, whereby each mirror element SE is set in a predetermined orientation. The rays reflected at respective predetermined angles by the mirror elements SE of the spatial light modulator 23a travel through the afocal lens 4 and zoom lens 7 to form a light intensity distribution (illumination pupil luminance distribution) of a multi-polar shape (quadrupolar, pentapolar, . . . ) or another shape on the rear focal point of the cylindrical micro fly's eye lens 8 or on the illumination pupil near it. This illumination pupil luminance distribution varies similarly (isotropically) by the action of the zoom lens 7.

Specifically, laterally polarized light reflected at respective predetermined angles by the mirror elements SE of the spatial light modulator 23a in the spatial light modulation unit 74A forms, for example, two circular light intensity distributional areas 41a and 41b spaced in the Z-direction with a center on the optical axis AX, on the pupil plane 4c of the afocal lens 4, as shown in FIG. 4. The light forming the light intensity distributional areas 41a and 41b has the polarization direction along the X-direction as indicated by double-headed arrows in the drawing.

Similarly, vertically polarized light reflected at respective predetermined angles by the mirror elements of the spatial light modulator in the spatial light modulation unit 74B forms, for example, two circular light intensity distributional areas 41c and 41d spaced in the X-direction with a center on the optical axis AX, on the pupil plane 4c of the afocal lens 4, as shown in FIG. 4. The light forming the light intensity distributional areas 41c and 41d has the polarization direction along the Z-direction as indicated by double-headed arrows in the drawing.

The light forming the quadrupolar light intensity distribution 41 on the pupil plane 4c of the afocal lens 4 forms quadrupolar light intensity distributional areas corresponding to the light intensity distributional areas 41a-41d, on the entrance surface of the cylindrical micro fly's eye lens 8, and on the rear focal plane of the cylindrical micro fly's eye lens 8 or on the illumination pupil near it (the position where the aperture stop 9 is arranged). Furthermore, quadrupolar light intensity distributional areas corresponding to the light intensity distributional areas 41a-41d are also fowled at other illumination pupil positions optically conjugate with the aperture stop 9, i.e., at the pupil position of the imaging optical system 12 and at the pupil position of the projection optical system PL.

In another example, the spatial light modulation unit 74A acts, for example, to form two circular light intensity distributional areas 42a and 42b spaced in the Z-direction with a center on the optical axis AX, and a circular light intensity distributional area 42c' with a center on the optical axis AX, as shown in the left view in FIG. 5, on the pupil plane 4c of the afocal lens 4. The light forming the light intensity distributional areas 42a, 42b, 42c' has the polarization direction along the X-direction as indicated by double-headed arrows in the drawing. On the other hand, the spatial light modulation unit 74B acts, for example, to form two circular light intensity distributional areas 42d and 42e spaced in the X-direction with a center on the optical axis AX, and a circular light intensity distributional area 42c" with a center on the optical axis AX, as shown in the center view in FIG. 5, on the pupil plane 4c of the afocal lens 4. The light forming the light intensity distributional areas 42d, 42e, 42c" has the polarization direction along the Z-direction as indicated by double-headed arrows in the drawing.

As a consequence, the light intensity distributional areas 42a-42e of the pentapolar shape are formed on the pupil plane 4c of the afocal lens 4, as shown in the right view in FIG. 5. The circular light intensity distributional area 42c with a center on the optical axis AX is formed by superposition of the light intensity distributional areas 42e and 42c". When an optical path length difference of not less than the temporal coherence length of the light source 1 is provided between the horizontally polarized light having traveled via the spatial light modulation unit 74A to reach the pupil plane 4c of the afocal lens 4 and the vertically polarized light having traveled via the spatial light modulation unit 74B to reach the pupil plane of the afocal lens 4, the beam with the polarization direction along the Z-direction and the beam with the polarization direction along the X-direction pass through the region of the light intensity distributional area 42c, as indicated by the double-headed arrows in the drawing.

In the modification example of FIG. 9, as described above, it is feasible to freely and quickly change the illumination pupil luminance distribution consisting of the first light intensity distribution in the laterally polarized state formed on the pupil plane by the action of the spatial light modulator in the spatial light modulation unit 74A and the second light intensity distribution in the vertically polarized state formed on the pupil plane by the action of the spatial light modulator in the spatial light modulation unit 74B. In other words, the modification example of FIG. 9 is also able to realize the illumination conditions of great variety in terms of the shape, size, and polarization state of the illumination pupil luminance distribution, by changing each of the shapes and sizes of the first light intensity distribution and the second light intensity distribution in mutually different polarization states, as in the embodiment of FIG. 1.

Since the modification example of FIG. 9 uses the diffractive optical element 71 as a light splitter, it has the advantage that an improvement can be made in evenness of the intensity of light incident to the spatial light modulators in the spatial light modulation units 74A, 74B. Since there is no variation in angles of the beams immediately after the diffractive optical element 71 even when the position of the beam incident to the diffractive optical element 71 varies, the modification example has the advantage that the positions of the beams incident to the spatial light modulators in the spatial light modulation units 74A, 74B are unlikely to vary.

In the modification example of FIG. 9, where a beam with a rectangular cross section is incident to the diffractive optical element 71, the incident beam may be split in the shorter-side direction of the rectangular cross section, in order to miniaturize the prism 23b and, therefore, miniaturize the spatial light modulation units 74A and 74B. In other words, the incident beam may be split in a plane a normal to which is a longitudinal direction of effective regions of the spatial light modulators in the spatial light modulation units 74A, 74B. In general, where the incident light has a sectional shape in which a length along a first direction in the cross section of the incident beam to the diffractive optical element 71 is smaller than a length along a second direction perpendicular to the first direction, the spatial light modulation units 74A and 74B can be compactified by splitting the incident beam along the first direction.

Figure 12:
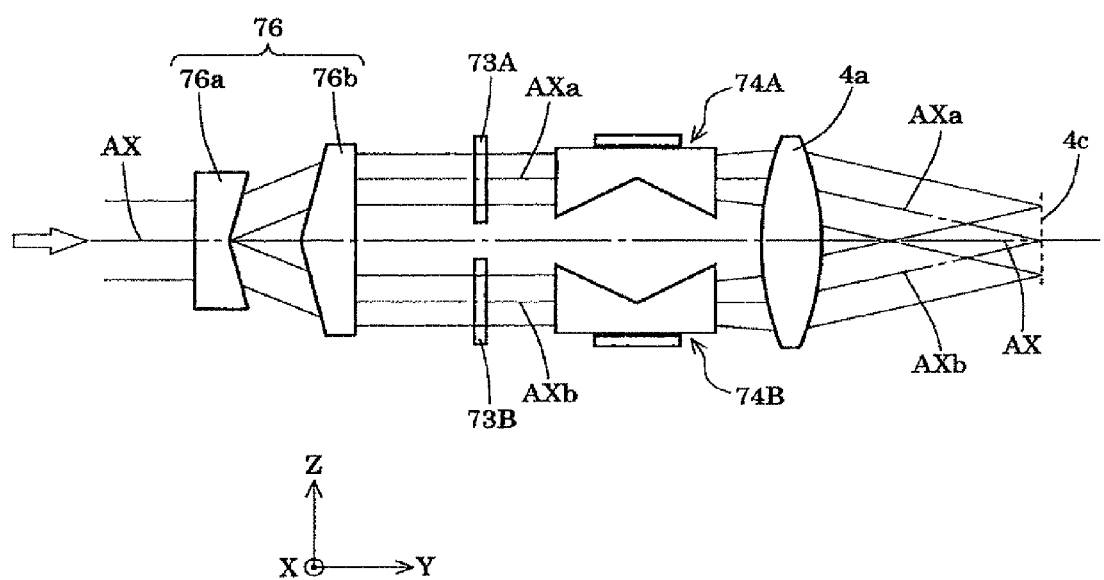
FIG. 12 is a drawing schematically showing a major configuration of a modification example using a prism unit as a light splitter.

In the modification example of FIG. 9, the diffractive optical element 71 is used to split the incident beam into two beams. However, without having to be limited to this, it is also possible to adopt a configuration of splitting the incident beam into two beams by use of a prism unit 76 having a pair of prism members 76a and 76b, for example, as shown in FIG. 12. The modification example of FIG. 12 has the configuration similar to the modification example of FIG. 9, but is different from the modification example of FIG. 9 only in that the prism unit 76 is arranged instead of the diffractive optical element 71 and the condenser lens 72. In FIG. 12, the elements with the same functionality as the constituent elements shown in FIG. 9 are denoted by the same reference symbols as those in FIG. 9. Since the modification example shown in FIG. 12 uses the prism unit 76 having the pair of prism members 76a and 76b, to split the incident beam into two beams, it becomes feasible to miniaturize the apparatus.

The prism unit 76 functioning as a light splitter in the modification example of FIG. 12 is composed of the following members arranged in the order named from the light source side (from the left in the drawing): first prism member 76a with a plane on the light source side and with a refracting surface of a concave and V-shape on the mask side (on the right in the drawing); and second prism member 76b with a plane on the mask side and with a refracting surface of a convex and V-shape on the light source side. The concave refracting surface of the first prism member 76a is composed of two planes and an intersecting line (ridge line) between them extends along the X-direction. The convex refracting surface of the second prism member 76b is formed so as to be complementary to the concave refracting surface of the first prism member 76a. Specifically, the convex refracting surface of the second prism member 76b is also composed of two planes and an intersecting line (ridge line) between them extends along the X-direction. In the modification example of FIG. 12, the prism unit 76 as a light splitter is composed of the pair of prism members 76a and 76b, but it is also possible to construct the light splitter of at least one prism. Furthermore, it is possible to contemplate various forms for specific configurations of the light splitter.

In the modification example of FIG. 9 and the modification example of FIG. 12, each of the half wave plates 73A and 73B is provided in the optical path between the condenser lens 72 and the spatial light modulation units 74A and 74B. However, without having to be limited to this, the half wave plates 73A and 73B can also be located at another appropriate position in the optical path of the first beam and at another appropriate position in the optical path of the second beam out of the two beams split by the diffractive optical element 71 or by the prism unit 76.

In the modification example of FIG. 9 and the modification example of FIG. 12, the half wave plate 73A rotatable around the predetermined axis is provided in the optical path of the first beam and the half wave plate 7313 rotatable around the predetermined axis is provided in the optical path of the second beam. However, without having to be limited to this, it is also possible to adopt a configuration wherein a half wave plate is provided so as to be rotatable around a predetermined axis or stationary, in at least one optical path, or a configuration wherein, a polarizer or an optical rotator other than the half wave plate is provided so as to be rotatable around a predetermined axis or stationary, in at least one optical path.

The half wave plate (polarizer or optical rotator in general) may be arranged as detachable from the optical path so that it can be retracted from the optical path when not needed, which can lengthen the life of the half wave plate. Similarly, the half wave plate (polarizer or optical rotator in general) can be arranged as replaceable with a glass substrate having the same path length, which can also lengthen the life of the half wave plate.

When a quarter wave plate rotatable around a predetermined axis is arranged in addition to the half wave plate, elliptically polarized light can be controlled into desired linearly polarized light. A depolarizer (depolarizing element) can also be used in addition to or instead of the half wave plate, whereby the light can be obtained in a desired unpolarized state. It is also possible, for example, to insert a plane-parallel plate of a required thickness in one optical path so as to provide the path length difference of not less than the temporal coherence length between the first beam and the second beam as described above, whereby a beam passing through the same region on the illumination pupil can be depolarized. Furthermore, when the optical path length difference of not less than the temporal coherence length is provided between the first beam and the second beam, speckle can be reduced by about $\sqrt{(1/2)}$.

Since the illumination optical apparatus according to the embodiment and modification examples uses the optical unit (spatial light modulation unit) with the pair of spatial light modulators in which the postures of the mirror elements are individually varied, it is feasible to freely and quickly change the illumination pupil luminance distribution consisting of the first light intensity distribution in the first polarization state formed on the illumination pupil by the action of the first spatial light modulator and the second light intensity distribution in the second polarization state formed on the illumination pupil by the action of the second spatial light modulator. In other words, by changing each of the shapes and sizes of the first light intensity distribution and the second light intensity distribution in mutually different polarization states, it is feasible to realize the illumination conditions of great variety in terms of the shape, size, and polarization state of the illumination pupil luminance distribution.

In this manner, the illumination optical apparatus according to the embodiment and the modification examples is able to realize the illumination conditions of great variety in terms of the shape, the size, and the polarization state of the illumination pupil luminance distribution. Furthermore, the exposure apparatus according to the embodiment and modification examples is able to perform good exposure under an appropriate illumination condition realized according to a pattern characteristic of a mask M, using the illumination optical apparatus capable of realizing the illumination conditions of great variety, and, therefore, to manufacture good devices.

In the above-described embodiment and each modification example, the apparatus may also be configured as follows: a pupil luminance distribution measuring device is used to measure the illumination pupil luminance distribution during formation of the illumination pupil luminance distribution by means of the spatial light modulation unit and each spatial light modulator in the spatial light modulation unit is controlled according to the result of the measurement. Such technology is disclosed, for example, in Japanese Patent Application Laid-open No. 2006-54328, and Japanese Patent Application Laid-open No. 2003-22967 and U.S. Pat. Published Application No. 2003/0038225 corresponding thereto. The teachings in U.S. Pat. Published Application No. 2003/0038225 are incorporated herein by reference.

In the aforementioned embodiment, the mask can be replaced by a variable pattern forming device which forms a predetermined pattern on the basis of predetermined electronic data. The use of this variable pattern forming device minimizes the effect on synchronization accuracy even when the pattern surface is vertical. The variable pattern forming device applicable herein can be, for example, a DMD (Digital Micromirror Device) including a plurality of reflecting elements driven based on predetermined electronic data. The exposure apparatus using DMD is disclosed, for example, in Japanese Patent Application Laid-open No. 2004-304135 and International Publication WO2006/080285 and U.S. Pat. Published Application No. 2007/0296936 corresponding thereto. Besides the reflective spatial light modulators of the non-emission type like DMD, it is also possible to use transmissive spatial light modulators or to use self-emission type image display devices. The variable pattern forming device may also be used in cases where the pattern surface is horizontal. The teachings in U.S. Pat. Published Application No. 2007/0296936 are incorporated herein by reference.

The exposure apparatus according to the foregoing embodiment is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling blocks from the various sub-systems into the exposure apparatus include mechanical connections, wire connections of electric circuits, pipe connections of pneumatic circuits, etc. between the various sub-systems. It is needless to mention that there are assembling blocks of the individual sub-systems, before the assembling blocks from the various sub-systems into the exposure apparatus. After completion of the assembling blocks from the various sub-systems into the exposure apparatus, overall adjustment is carried out to ensure various accuracies as the entire exposure apparatus. The manufacture of exposure apparatus is desirably performed in a clean room in which the temperature, cleanliness, etc. are controlled.

Figure 13:
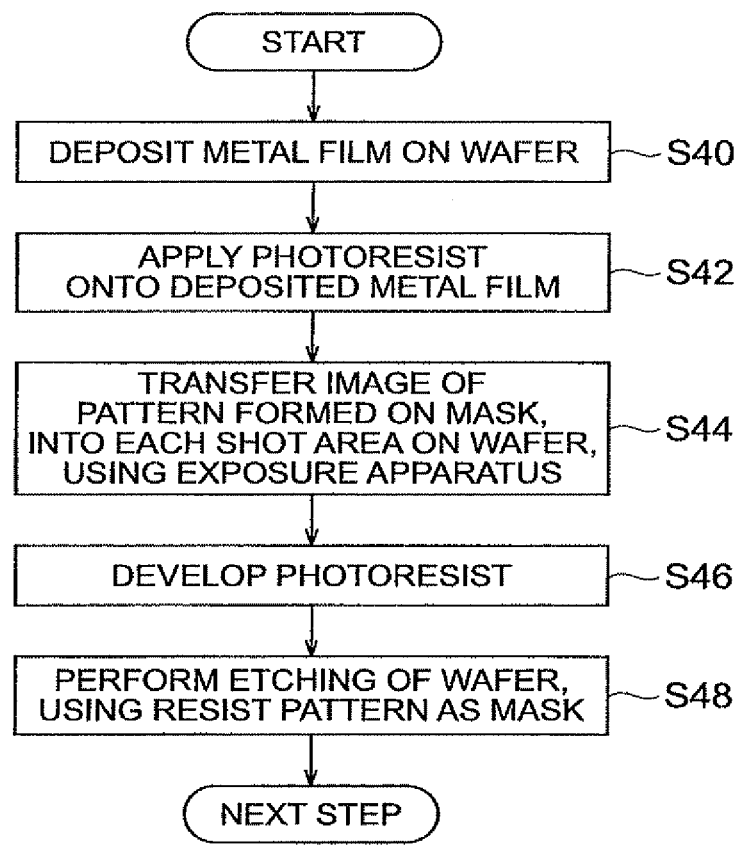
FIG. 13 is a flowchart showing manufacturing blocks of semiconductor devices.

The following will describe a device manufacturing method using the exposure apparatus of the above embodiment. FIG. 13 is a flowchart showing manufacturing blocks of semiconductor devices. As shown in FIG. 13, the manufacturing blocks of semiconductor devices include depositing a metal film on a wafer W to become a substrate for semiconductor devices (block S40); and applying a photoresist as a photosensitive substrate onto the deposited metal film (block S42). The subsequent blocks include transferring a pattern formed on a mask (reticle) M, into each shot area on the wafer W, using the projection exposure apparatus of the above embodiment (block S44: exposure block); and performing development of the wafer W after completion of the transfer, i.e., development of the photoresist onto which the pattern has been transferred (block S46: development block). A block subsequent thereto is to process the surface of the wafer W by etching or the like, using the resist pattern made on the surface of the wafer W in block S46, as a mask (block S48: processing block).

The resist pattern herein is a photoresist layer in which projections and depressions are formed in the shape corresponding to the pattern transferred by the projection exposure apparatus of the above embodiment, and which the depressions penetrate throughout. In the block S48, the surface of the wafer W is processed through this resist pattern. The processing carried out in the block S48 includes, for example, at least either etching of the surface of the wafer W or deposition of a metal film or the like. In the block S44, the projection exposure apparatus of the above embodiment performs the transfer of the pattern using the wafer W coated with the photoresist, as a photosensitive substrate or plate P.

Figure 14:
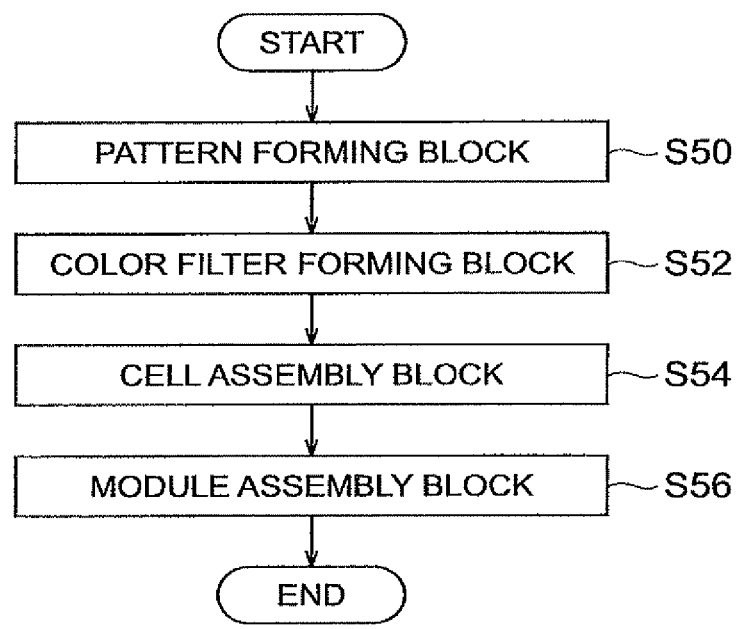
FIG. 14 is a flowchart showing manufacturing blocks of a liquid crystal device such as a liquid-crystal display device.

FIG. 14 is a flowchart showing manufacturing blocks of a liquid crystal device such as a liquid-crystal display device. As shown in FIG. 14, manufacturing blocks of the liquid crystal device include sequentially carrying out a pattern forming block (block S50), a color filter forming block (block S52), a cell assembly block (block S54), and a module assembly block (block S56).

The pattern forming block of block S50 is to form a predetermined pattern such as a circuit pattern and an electrode pattern on a glass substrate coated with a photoresist, as a plate P, using the projection exposure apparatus of the above embodiment. This pattern forming block includes an exposure block of transferring a pattern onto a photoresist layer by means of the projection exposure apparatus of the above embodiment; a development block of developing the plate P after the transfer of the pattern, i.e., developing the photoresist layer on the glass substrate, to make the photoresist layer in the shape corresponding to the pattern; and a processing block of processing the surface of the glass substrate through the developed photoresist layer.

The color filter forming block of block S52 is to form a color filter in a configuration wherein a large number of sets of three dots corresponding to R (Red), G (Green), and B (Blue) are arrayed in a matrix pattern, or in a configuration wherein a plurality of sets of three stripe filters of R, and B are arrayed in a horizontal scan direction.

The cell assembly block of block S54 is to assemble a liquid crystal panel (liquid crystal cell) using the glass substrate with the predetermined pattern thereon in block S50 and the color filter formed in block S52. Specifically, the liquid crystal panel is formed, for example, by pouring a liquid crystal into between the glass substrate and the color filter. The module assembly block of block S56 is to attach various components such as electric circuits and backlights for display operation of this liquid crystal panel, to the liquid crystal panel assembled in block S54.

Embodiments of the present invention is not limited to the application to the exposure apparatus for manufacture of semiconductor devices, but can also be widely applied, for example, to the exposure apparatus for display devices such as liquid-crystal display devices formed with rectangular glass plates, or plasma displays and to the exposure apparatus for manufacture of various devices such as imaging devices (CCDs or the like), micromachines, thin-film magnetic heads, and DNA chips. Furthermore, embodiments of the present invention can also be applied to the exposure block (exposure apparatus) in manufacture of masks (photomasks, reticles, etc.) with mask patterns of various devices by photolithography.

The aforementioned embodiment used the ArF excimer laser light (the wavelength: 193 nm) or the KrF excimer laser light (the wavelength: 248 nm) as the exposure light, but the exposure light does not have to be limited to these: embodiments of the present invention can also be applied to any other appropriate laser light source, e.g., an $F_2$ laser light source which supplies the laser light at the wavelength of 157 nm.

In the foregoing embodiment, it is also possible to apply a technique of filling the interior of the optical path between the projection optical system and the photosensitive substrate with a medium having the refractive index larger than 1.1 (typically, a liquid), which is so called a liquid immersion method. In this case, it is possible to adopt one of the following techniques as a technique of filling the interior of the optical path between the projection optical system and the photosensitive substrate with the liquid: the technique of locally filling the optical path with the liquid as disclosed in International Publication WO99/49504; the technique of moving a stage holding the substrate to be exposed, in a liquid bath as disclosed in Japanese Patent Application Laid-open No. 6-124873; the technique of forming a liquid bath of a predetermined depth on a stage and holding the substrate therein as disclosed in Japanese Patent Application Laid-open No. 10-303114, and so on. The teachings in WO99/49504, Japanese Patent Application Laid-open No. 6-124873, and Japanese Patent Application Laid-open No. 10-303114 are incorporated herein by reference.

The aforementioned embodiment was the application of the present invention to the illumination optical apparatus to illuminate the mask in the exposure apparatus, but, without having to be limited to this, the present invention can also be applied to any commonly-used illumination optical apparatus to illuminate an illumination target surface other than the mask.

Embodiments and modifications of the present invention can be utilized as an illumination optical apparatus suitably applicable to an exposure apparatus for manufacturing such devices as semiconductor devices, imaging devices, liquid-crystal display devices, and thin-film magnetic heads by lithography.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An optical unit comprising:
   a light splitter, arranged in a path of an incident beam, to split the incident beam into a plurality of beams;
   a first spatial light modulator which can be arranged in an optical path of a first beam out of the plurality of beams;
   a second spatial light modulator which can be arranged in an optical path of a second beam out of the plurality of beams; and
   a light combiner, arranged in a path of a beam having passed via the first spatial light modulator and a path of a beam having passed via the second spatial light modulator, to combine the beam having passed via the first spatial light modulator, with the beam having passed via the second spatial light modulator;
   wherein at least one spatial light modulator out of the first spatial light modulator and the second spatial light modulator includes a plurality of optical elements arranged two-dimensionally and controlled individually;
   wherein the incident beam has such a sectional shape that a length along a first direction in a cross section of the incident beam is smaller than a length along a second direction perpendicular to the first direction, and
   wherein the light splitter splits the incident beam along the first direction.

2. The optical unit according to claim 1, said optical unit being used in an illumination optical apparatus to illuminate an illumination target surface on the basis of light from a light source, the optical unit guiding light to a distribution forming optical system in the illumination optical apparatus in order to form a predetermined light intensity distribution on an illumination pupil of the illumination optical apparatus.

3. An illumination optical apparatus to illuminate an illumination target surface on the basis of light from a light source, the illumination optical apparatus comprising:
   the optical unit as set forth in claim 1; and
   a distribution forming optical system to form a predetermined light intensity distribution on an illumination pupil of the illumination optical apparatus, based on the beams having passed via the first and second spatial light modulators.

4. An exposure apparatus comprising the illumination optical apparatus as set forth in claim 3, for illuminating a predetermined pattern, the exposure apparatus performing exposure of the predetermined pattern on a photosensitive substrate.

5. A device manufacturing method comprising:
   effecting the exposure of the predetermined pattern on the photosensitive substrate, using the exposure apparatus as set forth in claim 4;
   developing the photosensitive substrate onto which the predetermined pattern has been transferred, to form a mask layer in a shape corresponding to the predetermined pattern on a surface of the photosensitive substrate; and
   processing the surface of the photosensitive substrate through the mask layer.

* * * * *